US010535660B1

(12) United States Patent
Chuang et al.

(10) Patent No.: US 10,535,660 B1
(45) Date of Patent: Jan. 14, 2020

(54) DYNAMIC RANDOM ACCESS MEMORY STRUCTURE AND METHOD FOR PREPARING THE SAME

(71) Applicant: NANYA TECHNOLOGY CORPORATION, New Taipei (TW)

(72) Inventors: Da-Zen Chuang, Taipei (TW); Sheng-Tsung Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/117,668

(22) Filed: Aug. 30, 2018

(51) Int. Cl.
  *H01L 27/108* (2006.01)
  *H01L 21/033* (2006.01)

(52) U.S. Cl.
  CPC .... *H01L 27/10805* (2013.01); *H01L 21/0337* (2013.01); *H01L 27/10855* (2013.01)

(58) Field of Classification Search
  None
  See application file for complete search history.

(56) References Cited

U.S. PATENT DOCUMENTS

| | | | | |
|---|---|---|---|---|
| 5,358,888 A | * | 10/1994 | Ahn | H01L 27/10817 438/396 |
| 5,401,681 A | * | 3/1995 | Dennison | H01L 21/768 257/296 |
| 6,048,763 A | * | 4/2000 | Doan | H01L 28/91 257/296 |
| 6,140,177 A | * | 10/2000 | Schafer | H01L 28/92 257/E21.02 |
| 9,318,494 B2 | * | 4/2016 | Kim | H01L 27/10885 |
| 9,455,206 B2 | * | 9/2016 | Yun | H01J 37/222 |
| 2004/0214391 A1 | * | 10/2004 | Chen | H01L 27/1087 438/243 |
| 2005/0139951 A1 | * | 6/2005 | Pyi | H01L 21/76232 257/510 |
| 2015/0028450 A1 | | 1/2015 | Park et al. | |
| 2016/0013109 A1 | * | 1/2016 | Yun | H01J 37/222 438/5 |
| 2016/0020213 A1 | * | 1/2016 | Kim | H01L 27/10885 438/381 |
| 2017/0148731 A1 | | 5/2017 | Saino | |

FOREIGN PATENT DOCUMENTS

TW 201427017 A 7/2014
WO WO-2014/050590 A1 4/2014

\* cited by examiner

*Primary Examiner* — Telly D Green
(74) *Attorney, Agent, or Firm* — Muncy, Geissler, Olds & Lowe, P.C.

(57) ABSTRACT

The present disclosure provides a DRAM cell structure. The DRAM cell structure includes a substrate, a gate structure disposed in the substrate, a first source/drain region and a second source/drain region disposed in the substrate respectively at two sides of the gate structure, a landing pad disposed over the second source/drain region, a plurality of conductive pillars disposed on the landing pad, a conductive layer disposed over the plurality of conductive pillars, and a dielectric layer disposed between the conductive layer and the plurality of conductive pillars. The plurality of conductive pillars have at least a first width and a second width, and the first width and the second width are different from each other.

11 Claims, 31 Drawing Sheets

DYNAMIC RANDOM ACCESS MEMORY STRUCTURE AND METHOD FOR PREPARING THE SAME

TECHNICAL FIELD

The present disclosure relates to a dynamic random access memory (DRAM) structure and a method for preparing the same, and more particularly, to a capacitor in a DRAM cell structure and a method for preparing the same.

DISCUSSION OF THE BACKGROUND

A DRAM cell structure typically includes a metal-oxide-semiconductor field effect transistor (MOSFET) device and a capacitor that are built in or on a semiconductor silicon substrate. The MOSFET device and the capacitor form a series connection with each other. Using a word line and a bit line, a DRAM cell structure can be read and programmed.

There is a continuing trend of increasing the storage density of integrated circuit memories to provide increased quantities of data storage on a single chip. To address the challenges of reduced structure sizes, DRAM designs have been proposed which incorporate capacitors having vertical extensions above the surface of the substrate ("stacked" capacitors) or below the surface of the substrate ("trenched" capacitors). By adopting a more three-dimensional structure, such DRAM designs provide memory capacitors having larger capacitance while occupying less surface area of the substrate.

However, when the critical dimension of a DRAM cell structure is reduced to sub-20 nm scale, the occupied area is too small to allow formation of a capacitor with a very tall, vertical cylinder shape using current photolithography processes. Therefore, there is a need for providing a method of preparing a capacitor having high capacitance in a DRAM cell structure.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM cell structure. The DRAM cell structure includes a substrate, a gate structure disposed in the substrate, a first source/drain region and a second source/drain region disposed in the substrate respectively at two sides of the gate structure, a landing pad disposed over the second source/drain region, a plurality of conductive pillars disposed on the landing pad, a conductive layer disposed over the plurality of conductive pillars, and a dielectric layer disposed between the conductive layer and the plurality of conductive pillars. In some embodiments, the plurality of conductive pillars have at least a first width and a second width, and the first width and the second width are different from each other.

In some embodiments, the plurality of conductive pillars are separated from each other by at least a first spacing distance and a second spacing distance, and the first spacing distance and the second spacing distance are different from each other.

In some embodiments, the plurality of conductive pillars have at least a first shape and a second shape, and the first shape and the second shape are different from each other.

In some embodiments, the DRAM cell structure further includes a dielectric structure and a contact plug disposed in the dielectric structure. In some embodiments, the contact plug electrically connects the second source/drain region and the landing pad.

In some embodiments, the DRAM cell structure further includes a bit line structure disposed on the first source/drain region. In some embodiments, the dielectric structure covers the bit line structure.

In some embodiments, an extending direction of the plurality of conductive pillars is perpendicular to a surface of the substrate.

Another aspect of the present disclosure provides a method for preparing a DRAM cell structure. The method includes the following steps. A substrate is provided. The substrate includes at least an active region, at least a gate structure disposed in the active region, and a first source/drain region and a second source/drain region disposed in the active region at two sides of the gate structure. A first conductive layer is formed over the substrate. A second conductive layer and a hard mask layer are sequentially formed on the first conductive layer. A hemispherical-grained (HSG) layer is formed on the hard mask layer. The hard mask layer is patterned through the HSG layer to form a hard mask pattern on the second conductive layer. The second conductive layer is etched through the hard mask pattern to form a plurality of conductive pillars over the substrate.

In some embodiments, the method further includes removing portions of the first conductive layer to form a landing pad before the forming of the second conductive layer.

In some embodiments, the method further includes removing portions of the HSG layer before the patterning of the hard mask layer.

In some embodiments, the method further includes removing several of the plurality of conductive pillars.

In some embodiments, the method further includes removing portions of the first conductive layer to form a landing pad simultaneously with the removing of the several of the plurality of conductive pillars.

In some embodiments, the method further includes forming a dielectric layer over the plurality of conductive pillars.

In some embodiments, sidewalls of the plurality of conductive pillars are in contact with the dielectric layer, and top surfaces of the plurality of conductive pillars are separated from the dielectric layer by the hard mask pattern.

In some embodiments, the method further includes removing the hard mask pattern before the forming of the dielectric layer.

In some embodiments, the top surfaces and sidewalls of the plurality of conductive pillars are in contact with the dielectric layer.

In some embodiments, the method further includes forming a third conductive layer on the dielectric layer.

In some embodiments, the plurality of conductive pillars have at least a first width and a second width, and the first width and the second width are different from each other.

In some embodiments, the plurality of conductive pillars are separated from each other by at least a first spacing distance and a second spacing distance, and the first spacing distance and the second spacing distance are different from each other.

In some embodiments, the plurality of conductive pillars have at least a first shape and a second shape, and the first shape and the second shape are different from each other.

In some embodiments, the method further includes forming a dielectric structure over the substrate, and forming a contact plug in the dielectric structure. In some embodiments, the contact plug electrically connects the second source/drain region and the first conductive layer.

In the present disclosure, the HSG layer is formed on the hard mask layer to define dimensions and locations of the plurality of conductive pillars which are used to form a bottom electrode of a capacitor in a DRAM memory cell. The hard mask layer is then patterned through the HSG layer to form the hard mask pattern, and the plurality of conductive pillars are formed by etching the second conductive layer through the hard mask pattern. It should be noted that because the HSG layer includes features that are separately formed without extra photolithography, the manufacturing method can be simplified. Further, a top surface of each of the plurality of conductive pillars may have a circular or elliptical shape, which is inherited from the HSG layer, and thus each of the plurality of conductive pillars may be a cylinder. Accordingly, a surface area of each of the plurality of conductive pillars is increased, and capacitance of the capacitor in the DRAM memory cell is thereby increased.

In contrast, with a comparative method applied without forming the HSG layer, photolithography and etching processes are required to define dimensions and locations of the plurality of conductive pillars. The comparative method therefore is complicated, and cost is increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
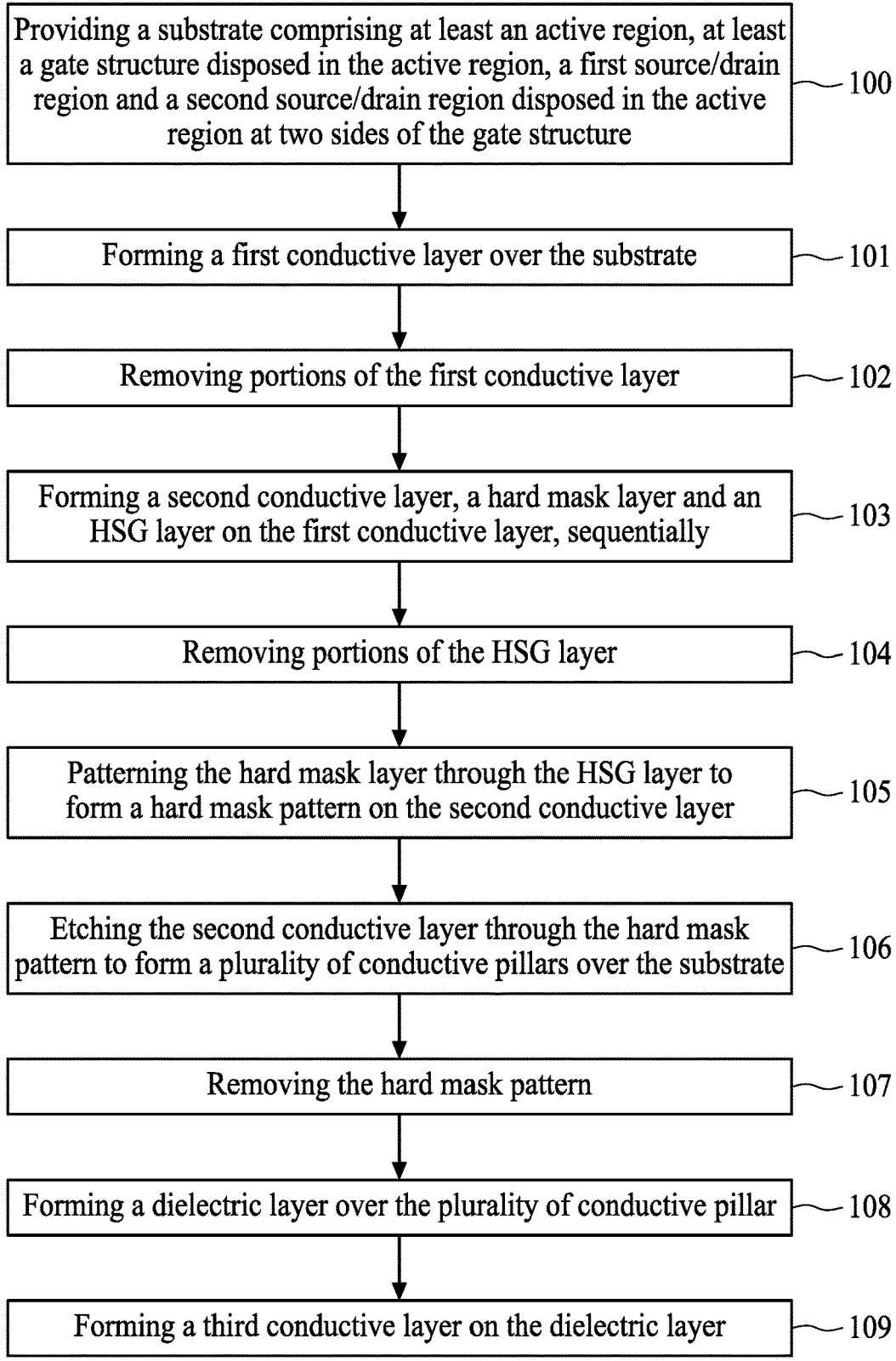
FIG. 1 is a flow diagram illustrating a method for preparing a DRAM cell structure, in accordance with a first embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a DRAM cell structure 10a in accordance with a first embodiment of the present disclosure. The method for preparing the DRAM cell structure 10a includes a step 100, providing a substrate. The substrate can include at least an active region, at least a gate structure disposed in the active region, and a first source/drain region and a second source/drain region disposed in the active region at two sides of the gate structure. The method for preparing the DRAM cell structure 10a further includes a step 101, forming a first conductive layer over the substrate. The method for preparing the DRAM cell structure 10a further includes a step 102, removing portions of the first conductive layer. In some embodiments, the portions of the first conductive layer are removed to form a landing pad. The method for preparing the DRAM cell structure 10a further includes a step 103, forming a second conductive layer, a hard mask layer and an HSG layer on the first conductive layer, sequentially. The method for preparing the DRAM cell structure 10a further includes a step 104, removing portions of the HSG layer. The method for preparing the DRAM cell structure 10a further includes a step 105, patterning the hard mask layer through the HSG layer to form a hard mask pattern on the second conductive layer. The method for preparing the DRAM cell structure 10a further includes a step 106, etching the second conductive layer through the hard mask pattern to form a plurality of conductive pillars on the second conductive layer. The method for preparing the DRAM cell structure 10a further includes a step 107, removing the hard mask pattern. The method for preparing the DRAM cell structure 10a further includes a step 108, forming a dielectric layer over the plurality of conductive pillars. The method for preparing the DRAM cell structure 10a further includes a step 109, forming a third conductive layer on the dielectric layer. The method for preparing the DRAM cell structure 10a will be further described according to one or more embodiments.

Figure 2:
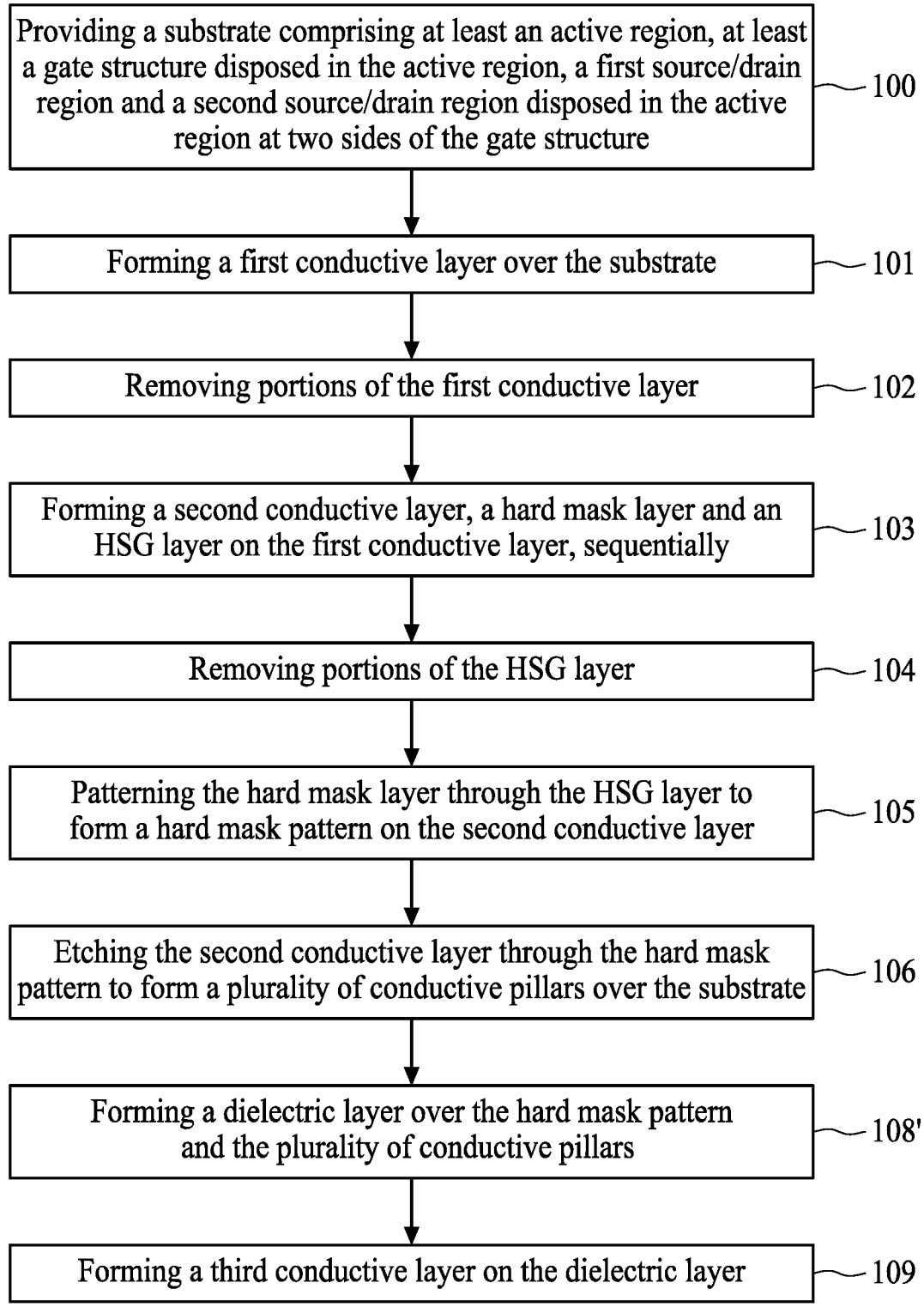
FIG. 2 is a flow diagram illustrating a method for preparing a DRAM cell structure, in accordance with a second embodiment of the present disclosure.

FIG. 2 is a flow diagram illustrating a method for preparing a DRAM cell structure 10b in accordance with a second embodiment of the present disclosure. It should be noted that step 100 to step 106 in the method 10b are similar to those in the method 10a, and therefore descriptions of such steps are omitted herein for brevity. The method 10b includes a step 108', forming a dielectric layer over the hard mask pattern and the plurality of the conductive pillars. The method for preparing the DRAM cell structure 10b further includes a step 109, which is the same as that in the method 10a, therefore it is omitted for brevity. The method for preparing the DRAM cell structure 10b will be further described according to one or more embodiments.

Figure 3:
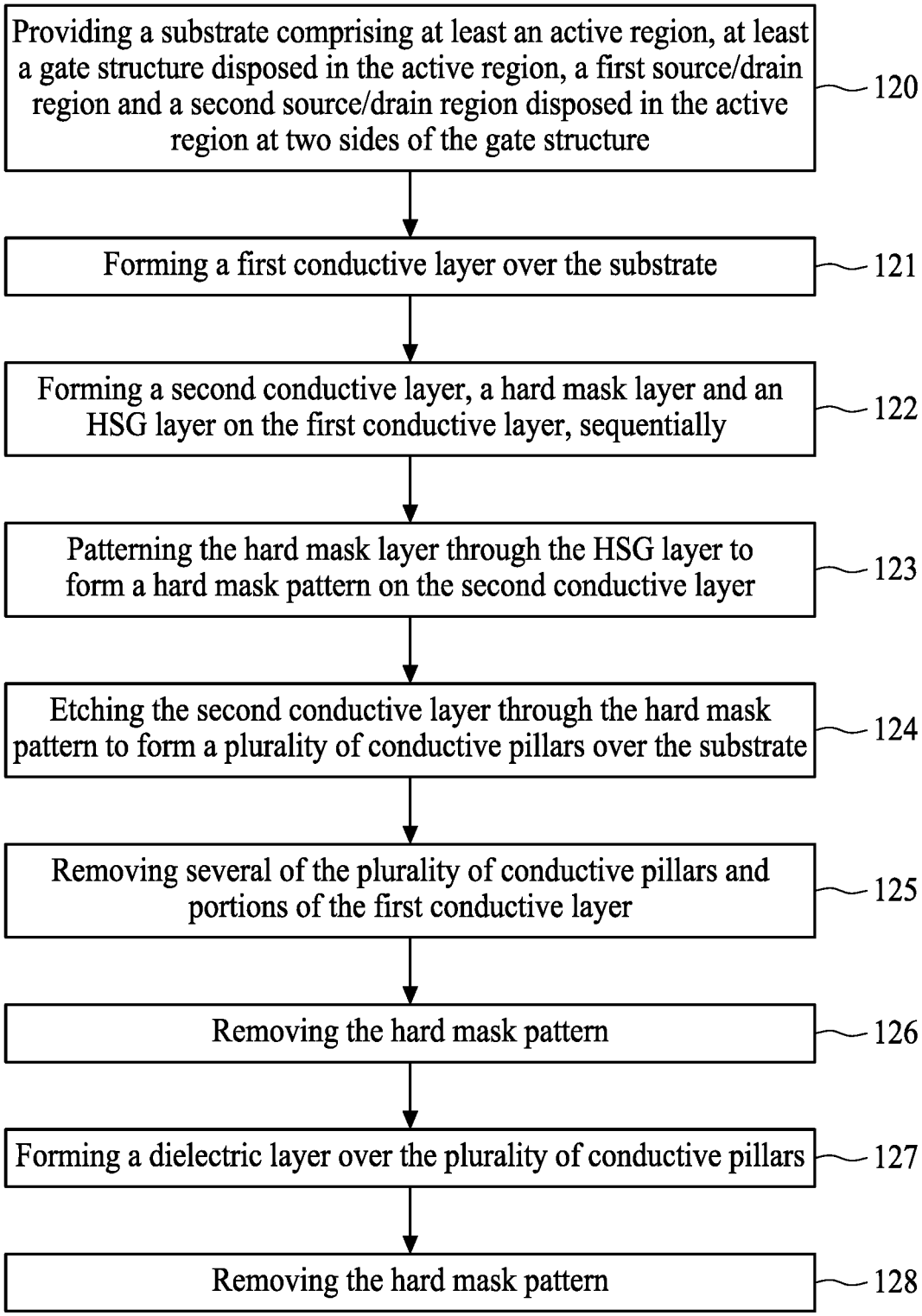
FIG. 3 is a flow diagram illustrating a method for preparing a DRAM cell structure, in accordance with a third embodiment of the present disclosure.

FIG. 3 is a flow diagram illustrating a method for preparing a DRAM cell structure 12a in accordance with a third embodiment of the present disclosure. The method for preparing the DRAM cell structure 12a includes a step 120, providing a substrate. The substrate can include at least an active region, at least a gate structure disposed in the active region, and a first source/drain region and a second source/drain region disposed in the active region at two sides of the gate structure. The method for preparing the DRAM cell structure 12a further includes a step 121, forming a first conductive layer over the substrate. The method for preparing the DRAM cell structure 12a further includes a step 122, forming a second conductive layer, a hard mask layer and an HSG layer on the first conductive layer, sequentially. The method for preparing the DRAM cell structure 12a further includes a step 123, patterning the hard mask layer through the HSG layer to form a hard mask pattern on the second conductive layer. The method for preparing the DRAM cell structure 12a further includes a step 124, etching the second conductive layer through the hard mask pattern to form a plurality of conductive pillars over the substrate. The method for preparing the DRAM cell structure 12a further includes a step 125, removing several of the plurality of conductive pillars and portions of the first conductive layer. In some embodiments, the portions of the first conductive layer are removed to form a landing pad. The method for preparing the DRAM cell structure 12a further includes a step 126, removing the hard mask pattern. The method for preparing the DRAM cell structure 12a further includes a step 127, forming a dielectric layer over the plurality of conductive pillars. The method for preparing the DRAM cell structure 12a further includes a step 128, forming a third conductive layer on the dielectric layer. The method for preparing the DRAM cell structure 12a will be further described according to one or more embodiments.

Figure 4:
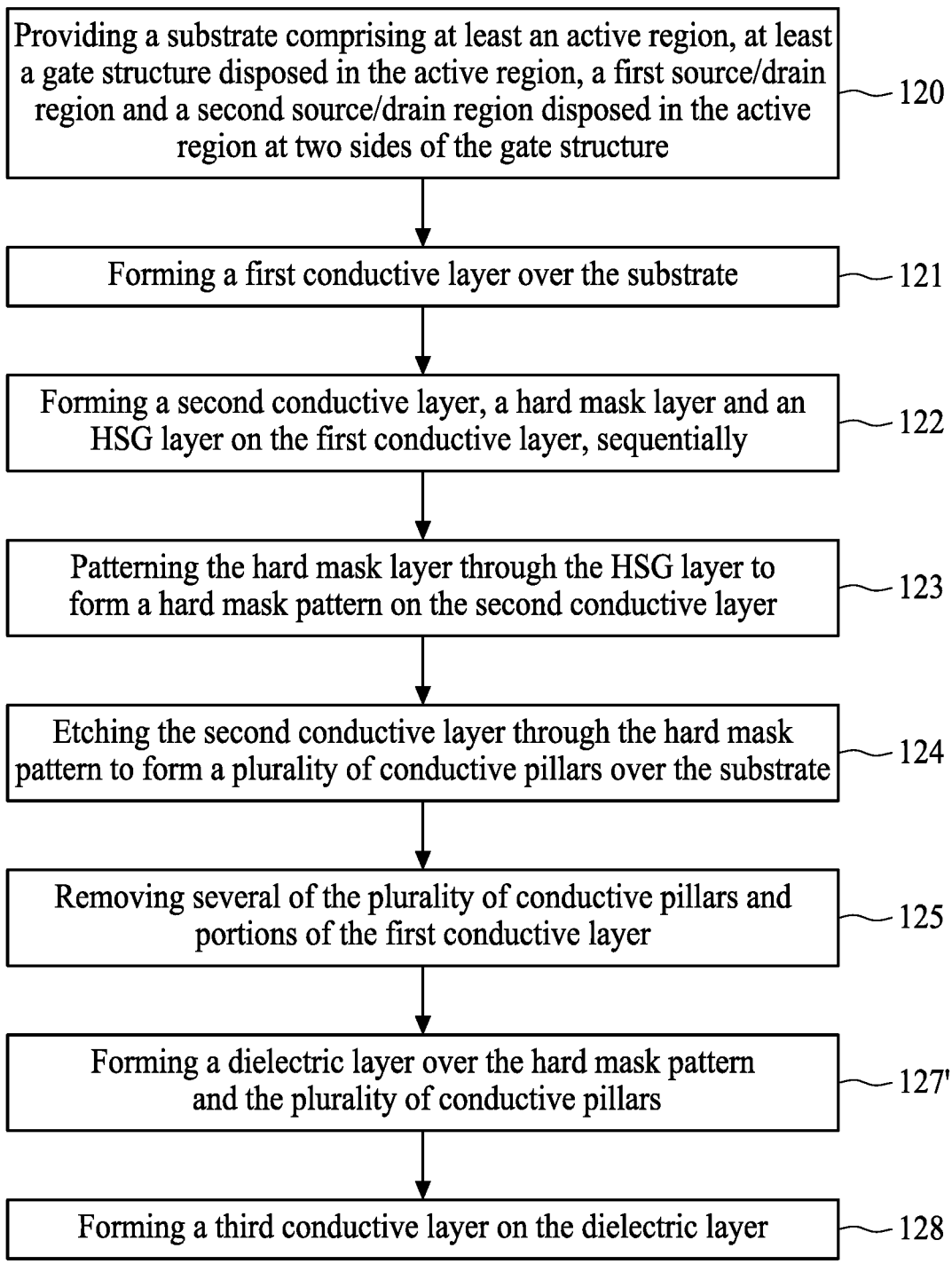
FIG. 4 is a flow diagram illustrating a method for preparing a DRAM cell structure, in accordance with a fourth embodiment of the present disclosure.

FIG. 4 is a flow diagram illustrating a method for preparing a DRAM cell structure 12b in accordance with a fourth embodiment of the present disclosure. It should be noted that step 120 to step 125 in the method 12b are similar to those in the method 12a, and therefore the descriptions of such steps are omitted herein for brevity. The method 12b includes a step 127, forming a dielectric layer over the hard mask pattern and the plurality of the conductive pillars. The method for preparing the DRAM cell structure 12b further includes a step 128, which is the same as the step 128 in the method 12a, and therefore is omitted for brevity. The method for preparing the DRAM cell structure 12b will be further described according to one or more embodiments.

Figure 5A:
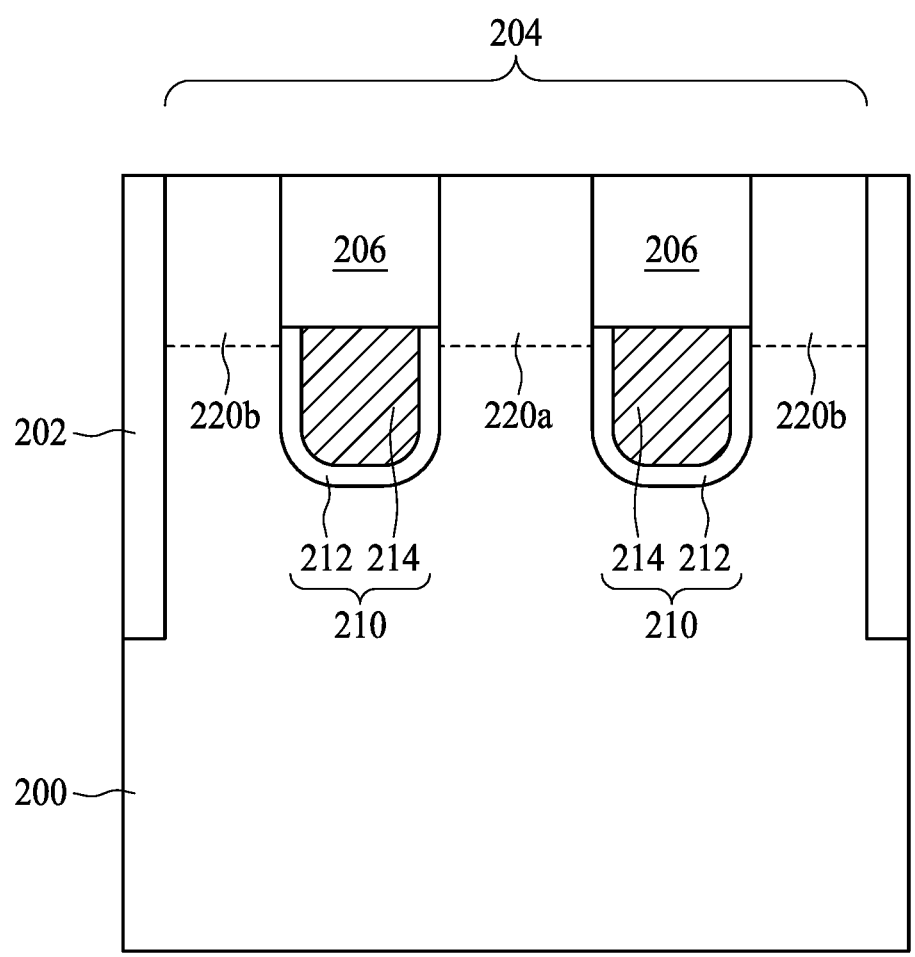
FIGS. 5A to 5K are schematic diagrams illustrating various fabrication stages of the method for preparing the DRAM cell structure in accordance with the first embodiment of the present disclosure.

FIGS. 5A to 5K are schematic diagrams illustrating various fabrication stages constructed according to the method for preparing the DRAM cell structure in accordance with the first embodiment of the present disclosure. Referring to FIG. 5A, a substrate 200 is provided according to step 100 of the method 10a. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof, but the disclosure is not limited thereto. A well region (not shown) may be formed in the substrate 200. The well region may be neutral, or may be an n-type or p-type doped region, depending on the conductivity type of the transistor structure formed thereafter. An isolation structure 202, such as a shallow trench isolation (hereinafter abbreviated as STI) structure, is formed in the substrate 200 for defining at least an active region 204.

Still referring to FIG. 5A, at least a gate structure 210 is subsequently disposed in the substrate 200 in the active region 204. In some embodiments, the gate structure 210 can be a buried gate structure, but the disclosure is not limited thereto. In some embodiments, two buried gate structures 210 can be formed in one active region 204, as shown in FIG. 5A, but the disclosure is not limited thereto. According to the embodiments, at least one trench (not shown) is formed in the substrate 200 by proper etchants. Next, a dielectric layer 212 covering sidewalls and a bottom of the trench is conformally formed in the trench. In some embodiments, the dielectric layer 212 can include dielectric material having high dielectric constant (high-k). For example, the dielectric layer 212 can include SiO, silicon nitride (SiN), silicon oxynitride (SiON), metal oxide such as hafnium oxide (HfO), or other suitable material chosen for compatibility, but the disclosure is not limited thereto. A conductive layer 214 is formed on the dielectric layer 212 and recessed such that a top surface of the conductive layer 214 is lower than an opening of the trench. In some embodiments, the conductive layer 214 can include polysilicon or other suitable material such as metal materials with proper work function, but the disclosure is not limited thereto. Next, an isolation structure 206 is formed to fill the trench, and a planarization process may be performed. Thus, a top surface of the active region 204 can be exposed, as shown in FIG. 5A. Consequently, the buried gate structure 210, which serves as a buried word line for a DRAM device, is obtained. As shown in FIG. 5A, a top surface of the buried gate structure 210 is lower than a surface of the substrate 200 or lower than a top surface of the isolation structure 202.

Next, a first source/drain region 220a and a second source/drain region 220b are formed in the active region 204 at two opposite sides of the buried gate structure 210. The first and second source/drain regions 220a and 220b includes an n-type or a p-type doped region, depending on the conductivity type of the transistor structure to be formed. In some embodiments, the first source/drain region 220a can be formed between the pair of buried gate structures 210, as shown in FIG. 5A. That is, the two buried gate structures 210 share one first source/drain region 220a. Accordingly, each buried gate structure 210 and the first and second source/drain regions 220a and 220b adjacent thereto may constitute a MOSFET device, which serves as a cell selection element. Further, because the buried gate structure 210 may have a three-dimensional structure, a channel length of the channel region may be increased, and a short-channel effect may be reduced.

Figure 5B:
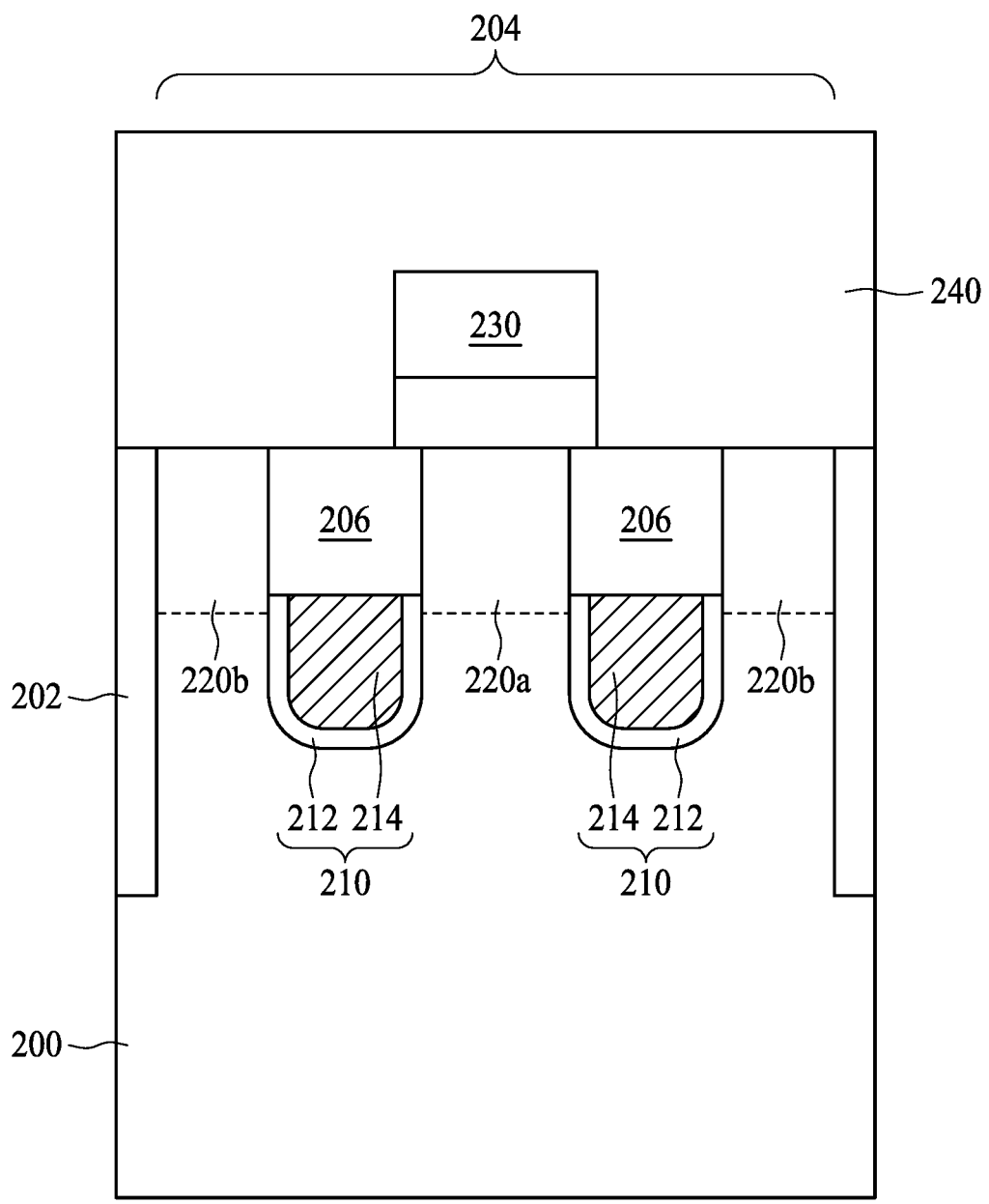

Referring to FIG. 5B, a bit line structure 230 is formed on the first source/drain region 220a. In some embodiments, a contact plug (not shown) can be formed between the bit line structure 230 and the first source/drain region 220a. After the forming of the bit line structure 230, a dielectric structure 240 is formed on the substrate 200. As shown in FIG. 5B, the dielectric structure 240 covers the bit line structure 230 and the substrate 200. In some embodiments, the dielectric structure 240 can be a single-layered structure. In other embodiments, the dielectric structure 240 can be a multi-layered structure.

Figure 5C:
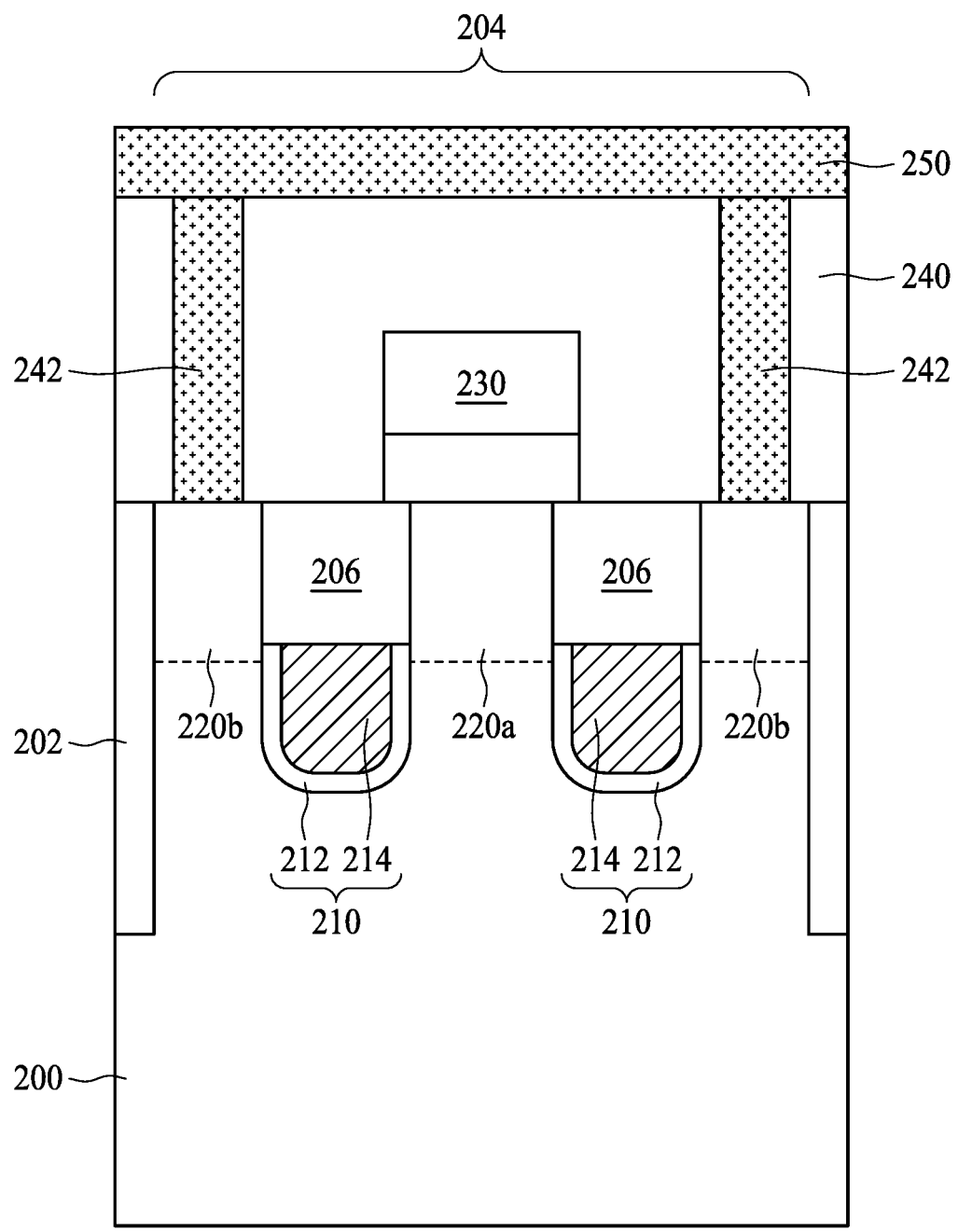

Referring to FIG. 5C, a contact plug 242 is formed in the dielectric structure 240. Further, the contact plug 242 is formed on the second source/drain region 220b for each MOSFET device. After the forming of the contact plugs 242, a first conductive layer 250 is formed over the substrate 200 according to step 101 of the method 10a. As shown in FIG. 5C, the first conductive layer 250 is formed to completely cover the dielectric structure 240 and the contact plugs 242. Further, the first conductive layer 250 is in contact with the contact plugs 242. The first conductive layer 250 can include doped polysilicon, tungsten, tungsten silicide, aluminum, titanium, titanium nitride, cobalt, but the disclosure is not limited thereto.

Figure 5D:
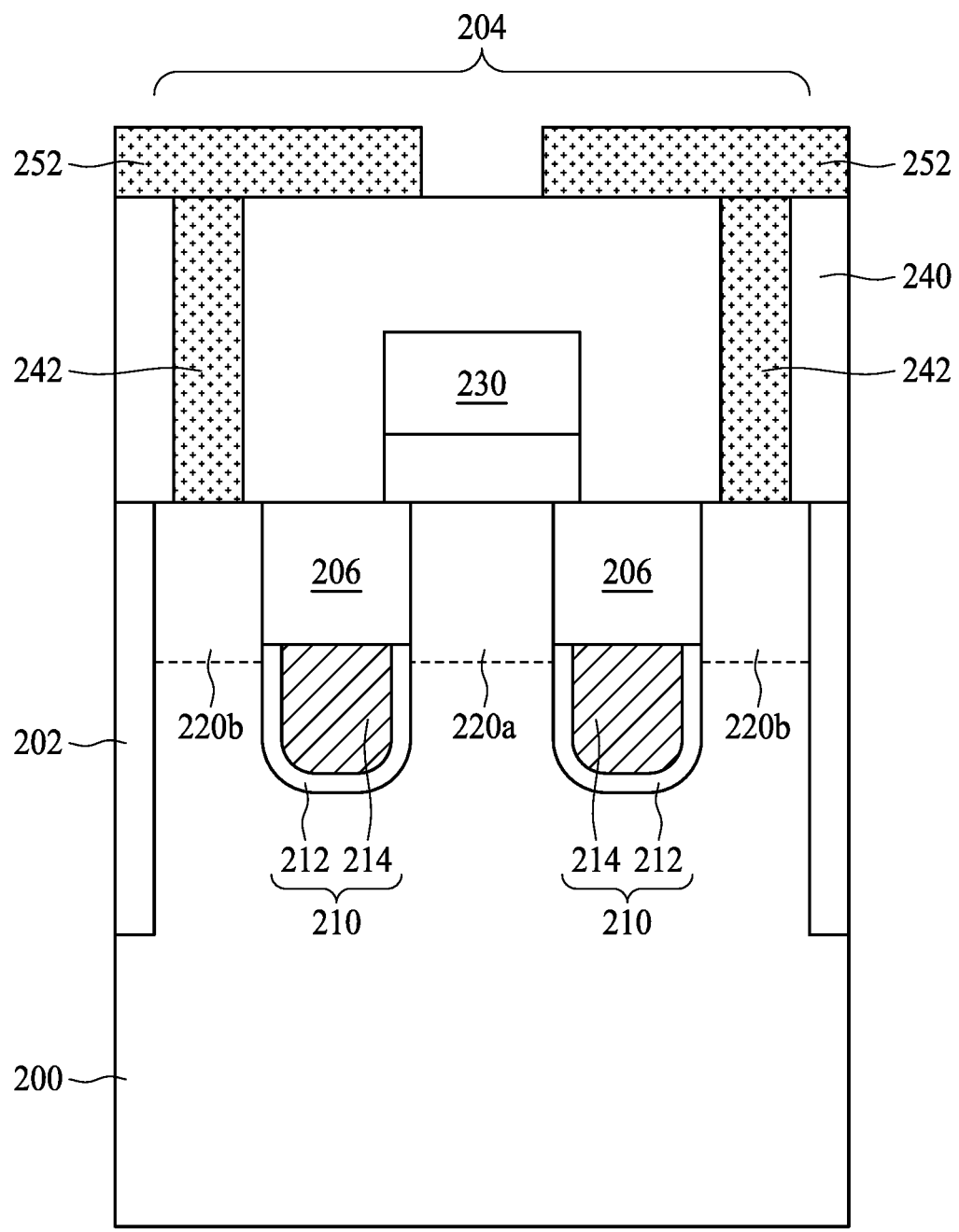

Referring to FIG. 5D, portions of the first conductive layer 250 are removed according to step 102 of the method 10a. The portions of the first conductive layer 250 are removed to form a landing pad 252 directly on each of the contact plugs 242, as shown in FIG. 5D. However, the landing pads 252 are physically and electrically insulated from each other.

Figure 5E:
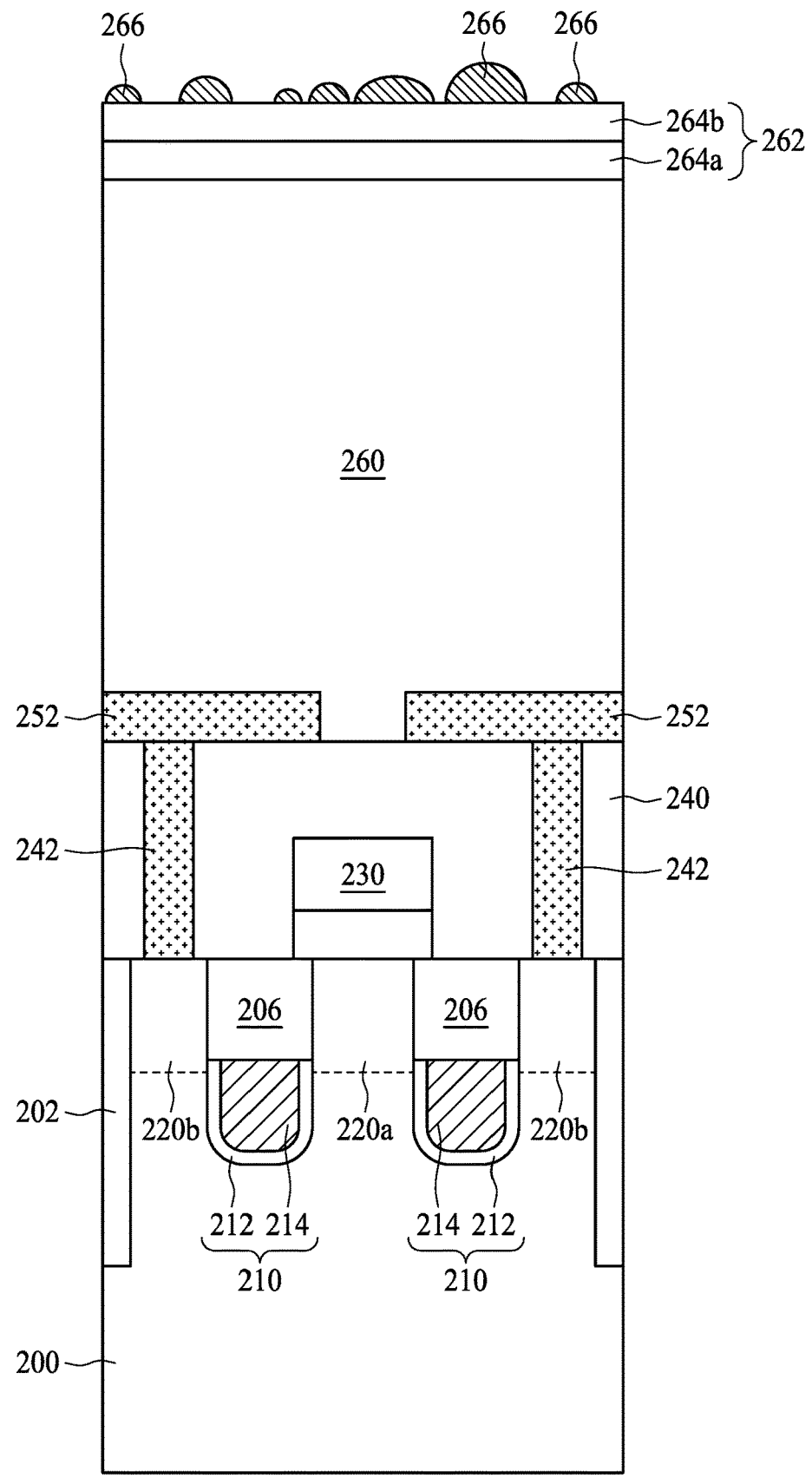

Referring to FIG. 5E, a second conductive layer 260, a hard mask layer 262 and an HSG layer 266 are sequentially formed on the first conductive layer (i.e., the landing pad 252) according to step 103 of the method 10a. In some embodiments, the second conductive layer 260 includes conductive material such as doped polysilicon or titanium nitride (TiN) composite, but the disclosure is not limited thereto. In some embodiments, a thickness of the second conductive layer 260 is between approximately 10000 angstroms (Å) and approximately 20000 Å, but the disclosure is not limited thereto. In some embodiments, the hard mask layer 262 can include a single-layered structure. In alternative embodiments, the hard mask layer 262 can include a multi-layered structure. For example, the hard mask layer 262 can include at least a first mask layer 264a and a second mask layer 264b, but the disclosure is not limited thereto.

Still referring to FIG. 5E, the HSG layer 266 is formed on the hard mask layer 262. In some embodiments, HSG layer 266 can be an undoped hemispherical-grained silicon (HSG-Si) layer. In some embodiments, the HSG layer 266 can be formed by a standard HSG-Si process referred to as "initial phase HSG-Si," which results in the formation of a large number of HSG-Si grains on the surface of the hard mask layer 262. For example but not limited thereto, the forming of the HSG layer 266 can include a high-temperature reaction of gasiform silicon alkyl or silicon dimethyl performed by a LP-CVD process with a temperature of about 500° C. to 660° C., but the disclosure is not limited thereto. Please refer to FIG. 9, which is a top view of the HSG layer 266 in accordance with some embodiments. In some embodiments, the HSG-Si grains in HSG layer 266 can have a half-circular shape or a half-elliptical shape. In some embodiments, the shapes of the HSG-Si grains in HSG layer 266 can be different. In some embodiments, a diameter of the HSG-Si grain size in the HSG layer 266 can be between approximately 10 Å and approximately 300 Å, but the disclosure is not limited thereto. The diameter of the HSG-Si grains can be adjusted by the HSG process. In some embodiments, a diameter of the HSG-Si grains in the HSG layer 266 can be different from each other, but the disclosure is not limited thereto. In some embodiments, a spacing distance between the adjacent HSG-Si grains in the HSG layer 266 can be between approximately 100 Å and approximately 500 Å, but the disclosure is not limited thereto. The spacing distance between the adjacent HSG-Si grains can be adjusted by the HSG process. It should be noted that the spacing distance between the adjacent HSG-Si grains in the HSG layer 266 is less than a minimum spacing distance that is achieved using photolithography techniques.

Figure 5F:
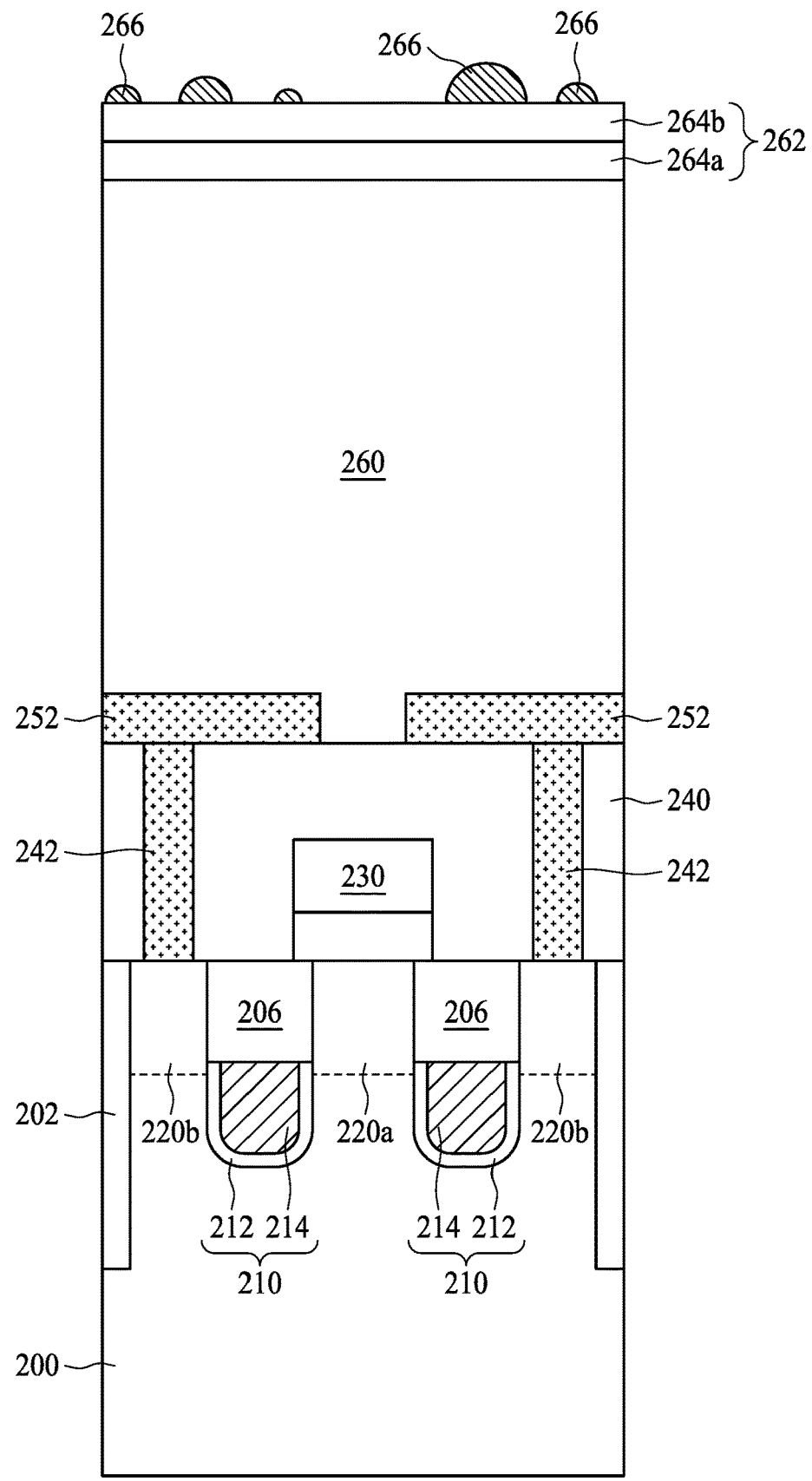

Referring to FIG. 5F, portions of the HSG layer 266 are removed according to step 104 of the method 10a. In some embodiments, several HSG-Si grains in the HSG layer 266 are removed. In some embodiments, a patterned sacrificial layer (not shown) can be formed over the HSG layer 266, and the portions of the HSG layer 266 exposed through the patterned sacrificial layer are removed. In some embodiments, the sacrificial layer is patterned using a photomask that is used to form the landing pads 252, but the disclosure is not limited thereto. The patterned sacrificial layer is removed after the removing of the portions of the HSG layer 266. Accordingly, each of the remaining HSG-Si grains in the HSG layer 266 overlaps the landing pads 252, as shown in FIG. 5F.

Figure 5G:
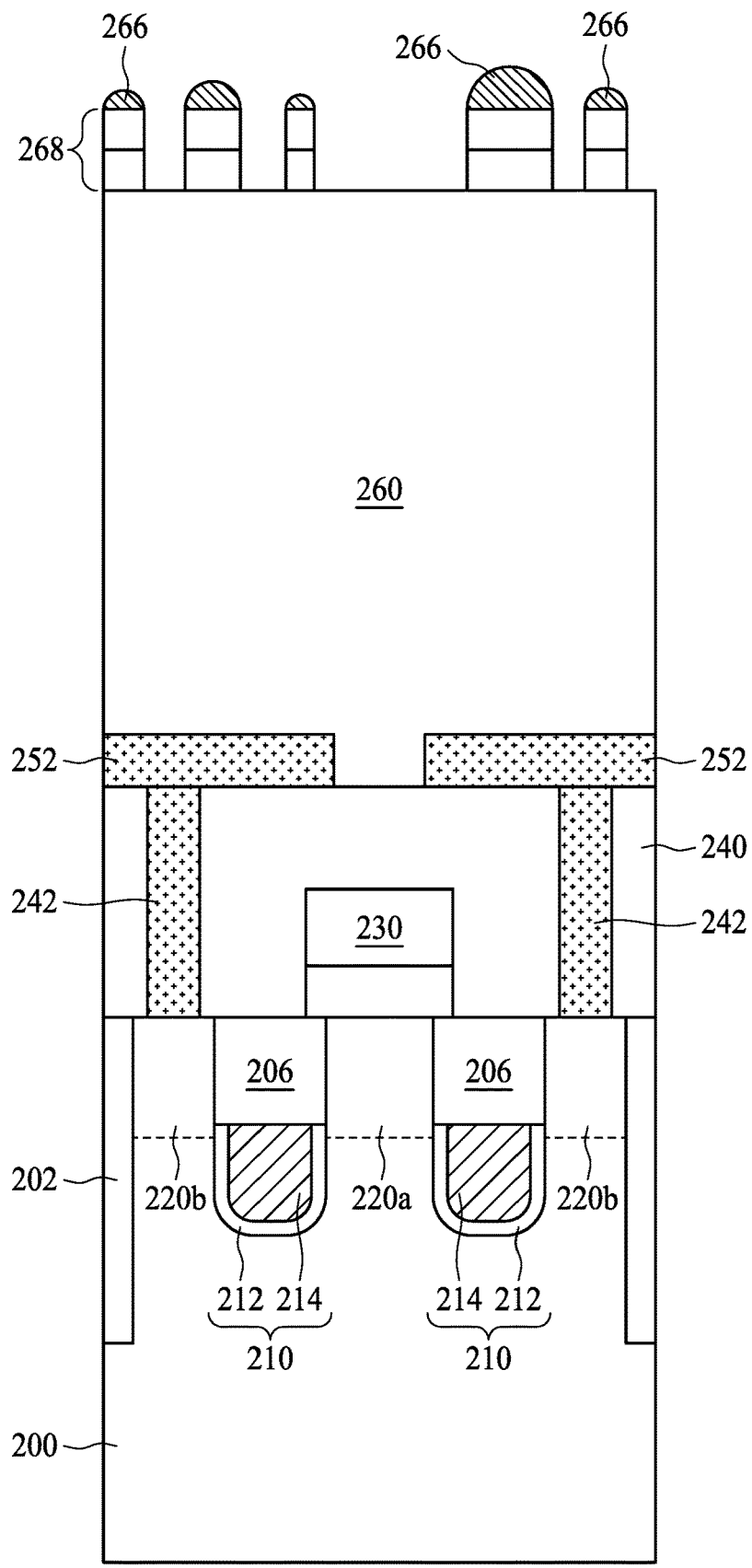

Referring to FIG. 5G, the hard mask layer 262 is patterned through the HSG layer 266 to form a hard mask pattern 268 on the second conductive layer 260, according to step 105 of the method 10a. Since the hard mask pattern 268 is obtained by transferring the HSG-Si grains in the HSG layer 266 to the hard mask layer 262, each feature in the hard mask pattern 268 inherits the diameter (or width) and the shape of the HSG-Si grain. Also, a spacing distance between adjacent features in the hard mask pattern 268 is the same as the spacing distance between the adjacent HSG-Si grains, as shown in FIG. 5G. In some embodiments, the HSG layer 266 may be removed after the forming of the hard mask pattern 268, but the disclosure is not limited thereto.

Figure 5H:
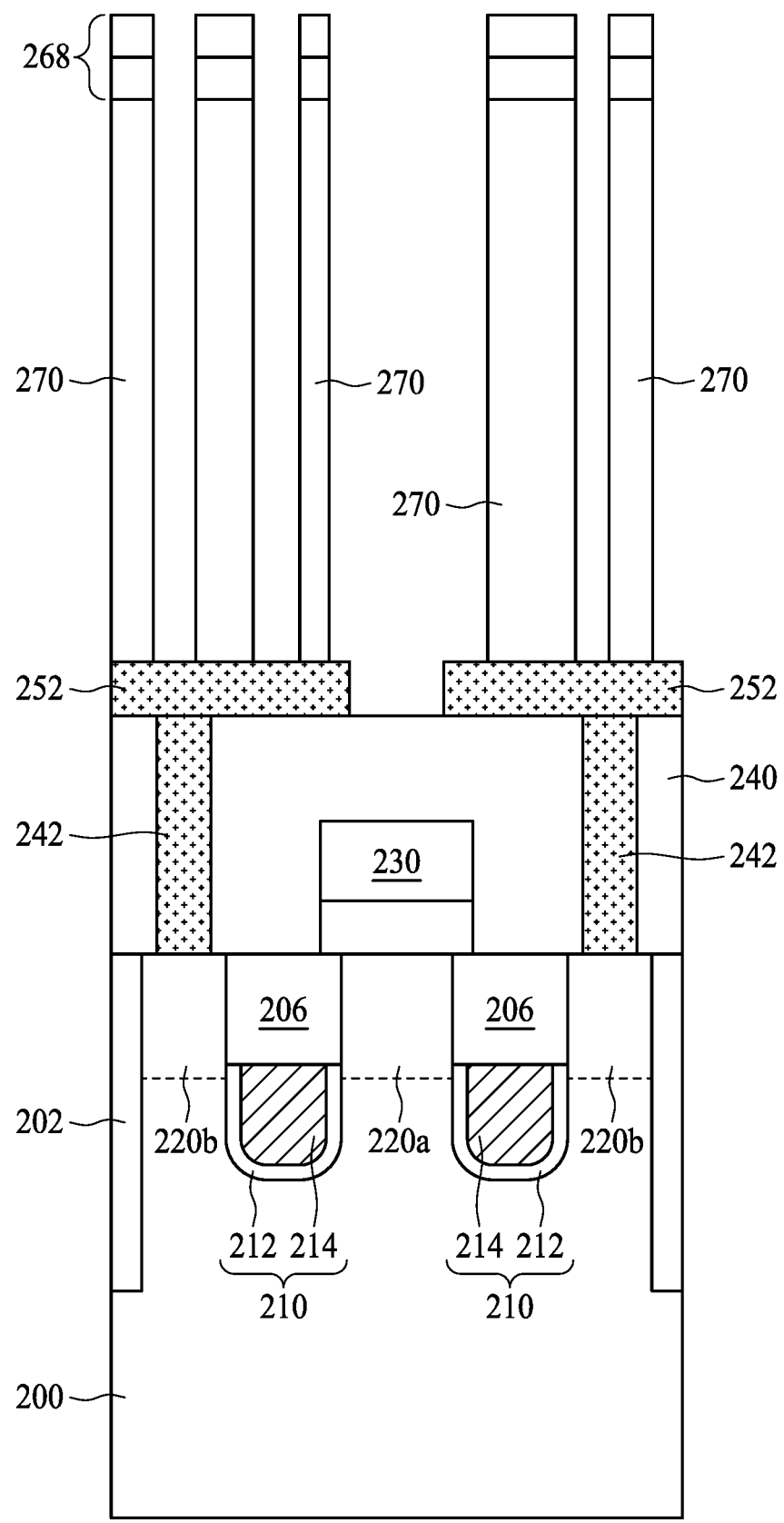

Referring to FIG. 5H, the second conductive layer 260 is etched through the hard mask pattern 268 to form a plurality of conductive pillars 270 over the substrate 200 according to step 106 of the method 10a. As shown in FIG. 5H, the plurality of conductive pillars 270 are formed on the landing pad 252 and separated from each other. Since the plurality of conductive pillars 270 are obtained by etching the second conductive layer 260 through the hard mask pattern 268, and the hard mask pattern 268 is obtained by transferring the HSG-Si grains in the HSG layer 266, a top surface of each of the plurality of conductive pillars 270 inherits the diameter (or width) and the shape of the HSG-Si grain. Also, a spacing distance between adjacent conductive pillars 270 is the same as the spacing distance between the adjacent HSG-Si grains, as shown in FIG. 5H. A height of each of the plurality of conductive pillars 270 is the same as the thickness of the second conductive layer 260.

Figure 5I:
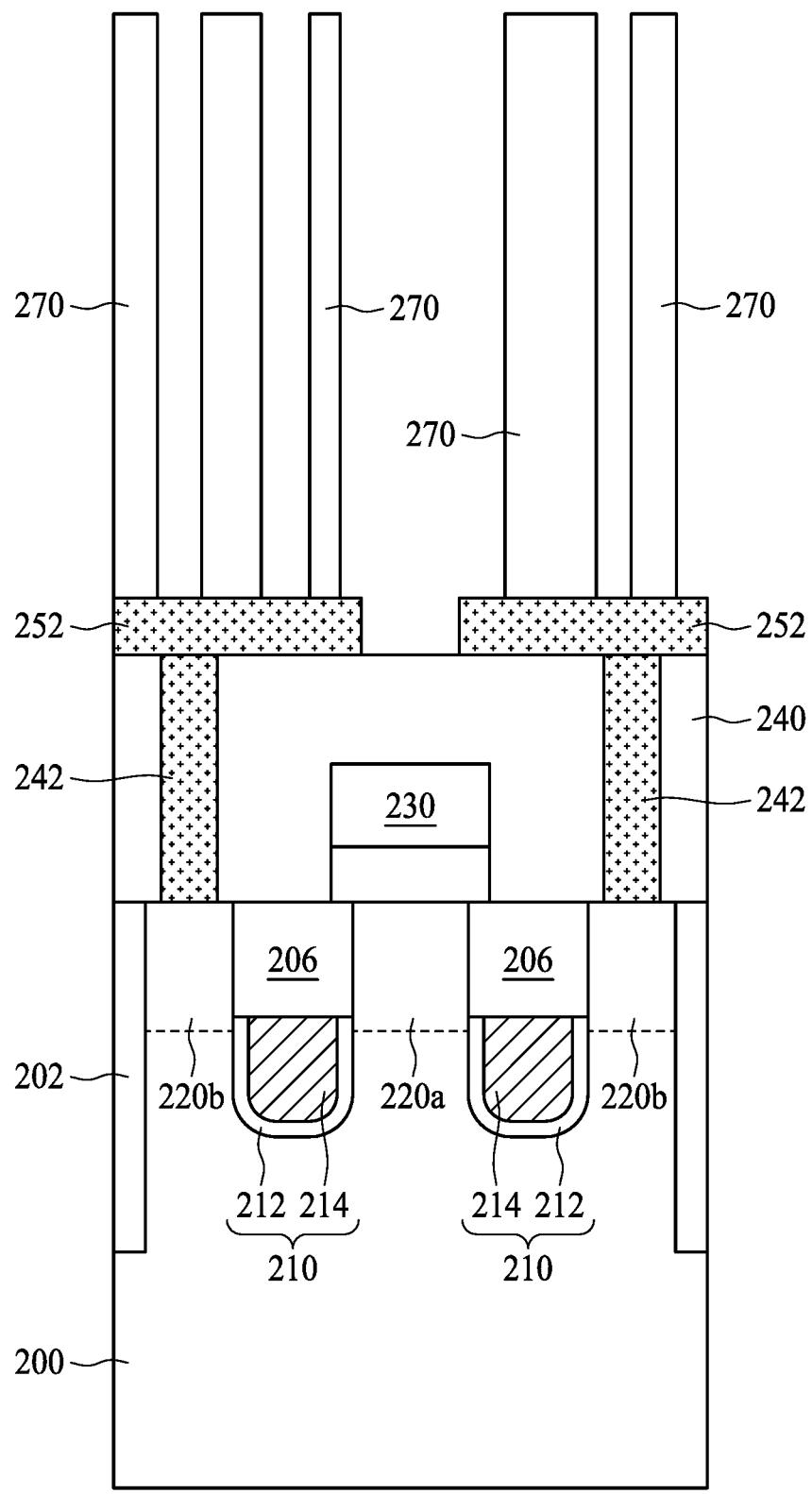

Referring to FIG. 5I, the hard mask pattern 268 is removed according to step 107 of the method 10a. Accordingly, the top surface and sidewalls of each of the plurality of conductive pillars 270 are exposed, and portions of the landing pad 252 are exposed, as shown in FIG. 5I.

Figure 5J:
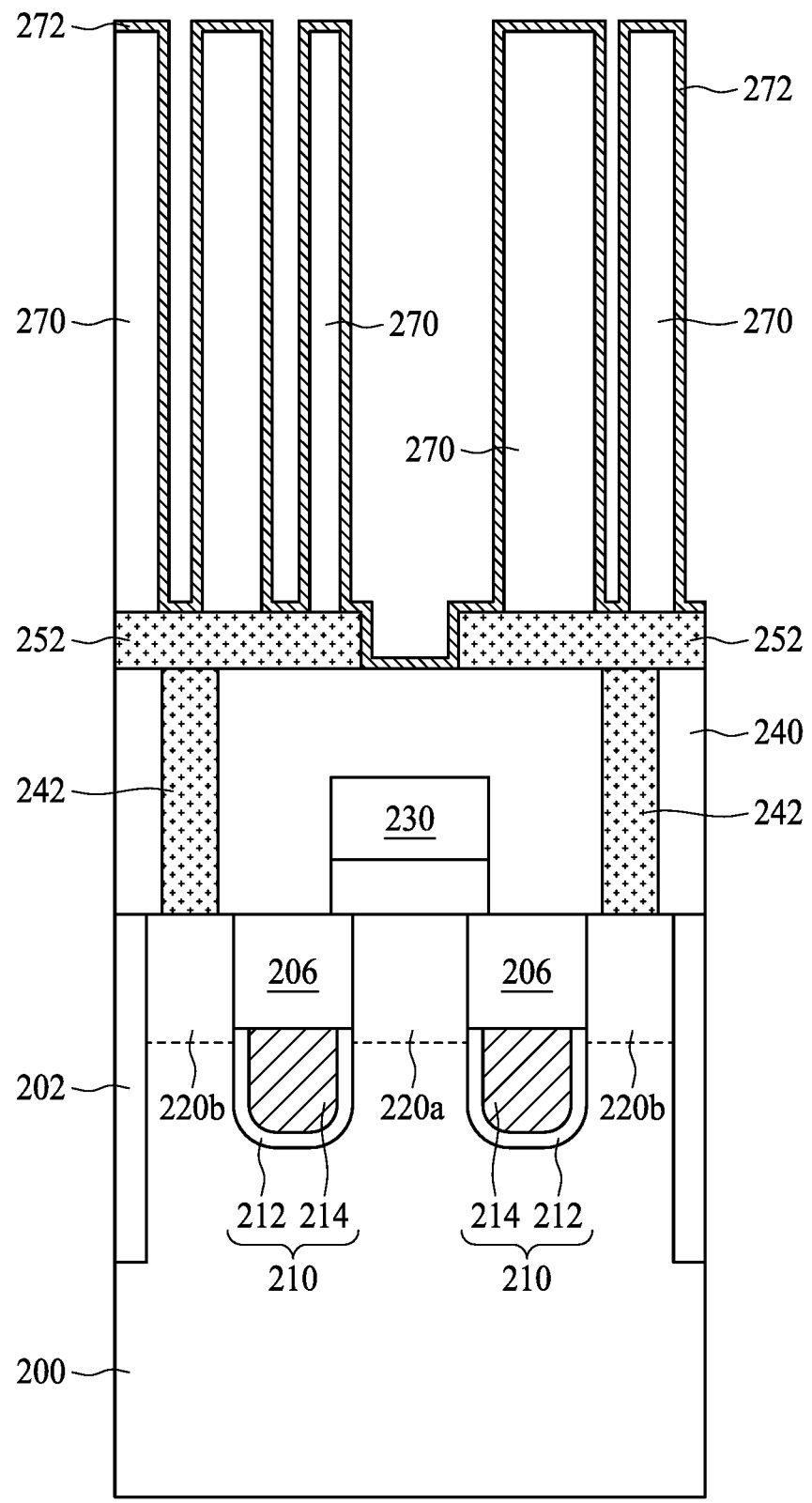

Referring to FIG. 5J, a dielectric layer 272 is formed over the plurality of conductive pillars 270 according to step 108 of the method 10a. As shown in FIG. 5J, the dielectric layer 272 is conformally formed to cover the top surfaces and the sidewalls of the plurality of conductive pillars 270. In some embodiments, the dielectric layer 272 includes silicon oxide (SiO), silicon nitride (SiN), nitride-oxide (NO), lanthanum oxide (LaO), mendelevium oxide (MdO), zirconium oxide (ZrO), or other high-k dielectric and composite materials. In some embodiments, a thickness of the dielectric layer 272 is between approximately 5 nanometers and approximately 20 nanometers, but the disclosure is not limited thereto.

Figure 5K:
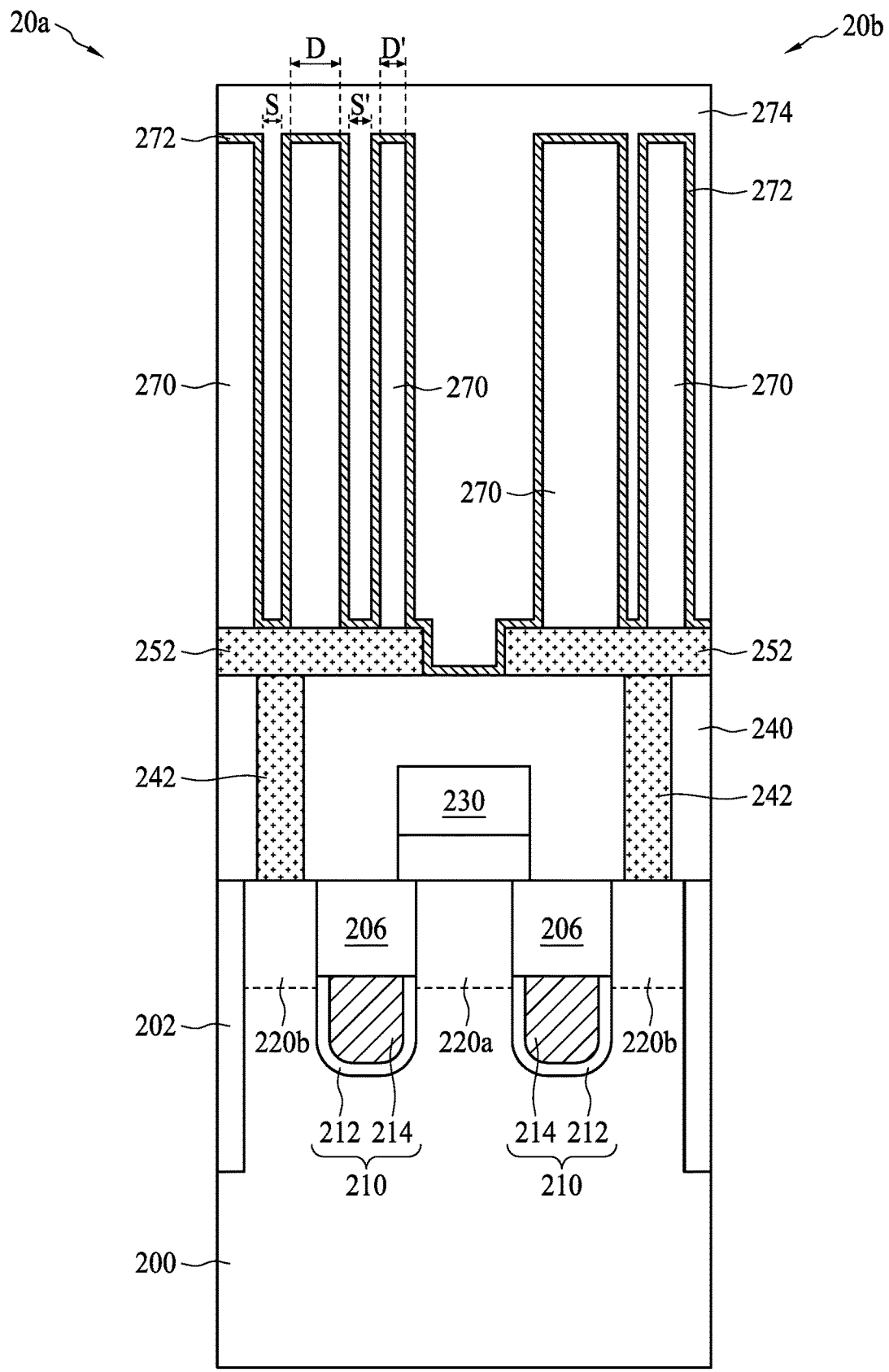

Referring to FIG. 5K, a third conductive layer 274 is formed on the dielectric layer 272 according to step 109 of the method 10a. In some embodiments, the third conductive layer 274 can include doped polysilicon, tungsten (W), tungsten silicide (WSi) or titanium nitride (TiN), but the disclosure is not limited thereto. In some embodiments, a thickness of the third conductive layer 274 is between approximately 1000 Å and approximately 2500 Å, but the disclosure is not limited thereto.

Accordingly, a DRAM cell structure 20a or a DRAM cell structure 20b is formed according to the method 10a. The DRAM cell structures 20a and 20b respectively include the substrate 200, the gate structure 210 (i.e., the buried gate structure 210) disposed in the substrate 200, the first source/drain region 220a and the second source/drain region 220b disposed in the substrate 200 at two sides of the buried gate structure 210, the bit line structure 230 disposed on the first source/drain region 220a, the landing pad 252 disposed over the second source/drain region 220b, the contact plug 242 disposed on the second source/drain region 220b for electrically connecting the landing pad 252 and the second source/drain region 220b, the plurality of conductive pillars 270 disposed on the landing pad 252, the third conductive layer 274 disposed over the plurality of conductive pillars 270, and the dielectric layer 272 disposed between the plurality of conductive pillars 270 and the third conductive layer 274. Further, the DRAM cell structure 20a and the DRAM cell structure 20b include the dielectric structure 240. The dielectric structure 240 covers the bit line structure 230, and the contact plug 242 is formed within the dielectric structure 240. As shown in FIG. 5K, an extending direction of the plurality of conductive pillars 270 is substantially perpendicular to a surface of the substrate 200, but the disclosure is not limited thereto.

As shown in FIG. 5K, each of the plurality of conductive pillars 270 on each landing pad 252 has at least a first width D and a second width D', and the first width D and the second width D' are different from each other. In some embodiments, the plurality of conductive pillars 270 on each landing pad are separated from each other by at least a first spacing distance S and a second spacing distance S', and the first spacing distance S and the second spacing distance S' are different from each other. In some embodiments, the plurality of conductive pillars 270 on each landing pad 252 have at least a first shape and a second shape, and the first shape and the second shape are different from each other. In some embodiments, the top surfaces and the sidewalls of the plurality of conductive pillars 270 are in contact with the dielectric layer 272, as shown in FIG. 5K.

According to the DRAM cell structure 20a or 20b provided by the first preferred embodiments, the conductive pillars 270 on each landing pad 252 may have different widths or shapes, and the spacing distances between adjacent conductive pillars 270 on each landing pad 252 may be different from each other. It should be noted that because the HSG-Si grains in the HSG layer 266, which is used to define dimensions and locations of the plurality of conductive pillars 270, are separately formed without extra photolithography, the manufacturing method can be simplified. Further, the top surface of each of the plurality of conductive pillars 270 may have a circular or elliptical shape, which is inherited from the HSG-Si grains, and thus each of the plurality of conductive pillars 270 may be a cylinder. Accordingly, a surface area of each of the plurality of conductive pillars 270 is increased, and capacitance of the capacitor in the DRAM memory cell 20a and 20b is thereby increased.

Figure 6A:
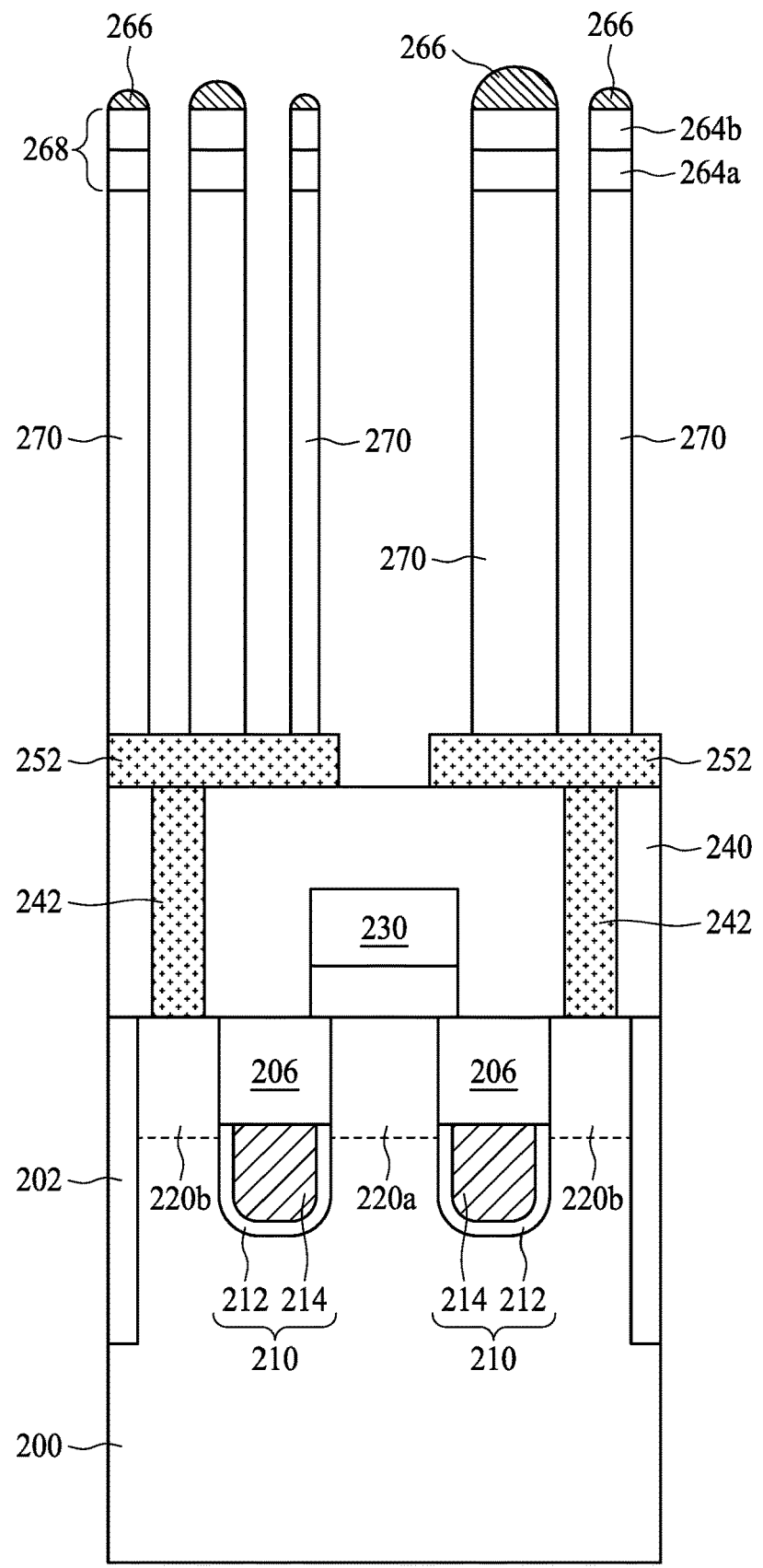
FIGS. 6A to 6C are schematic diagrams illustrating various fabrication stages of the method for preparing the DRAM cell structure in accordance with the second embodiment of the present disclosure.
Figure 6B:
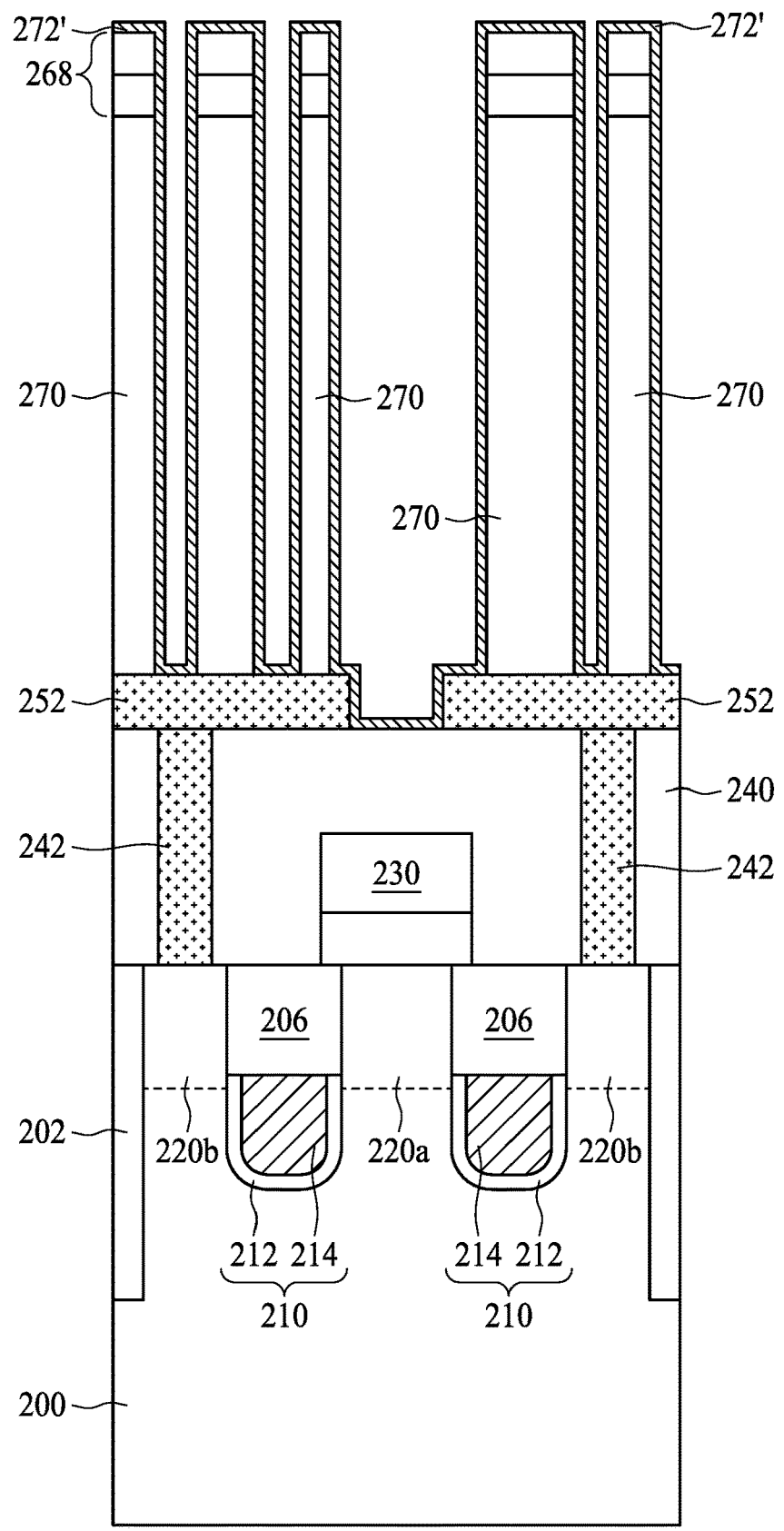
Figure 6C:
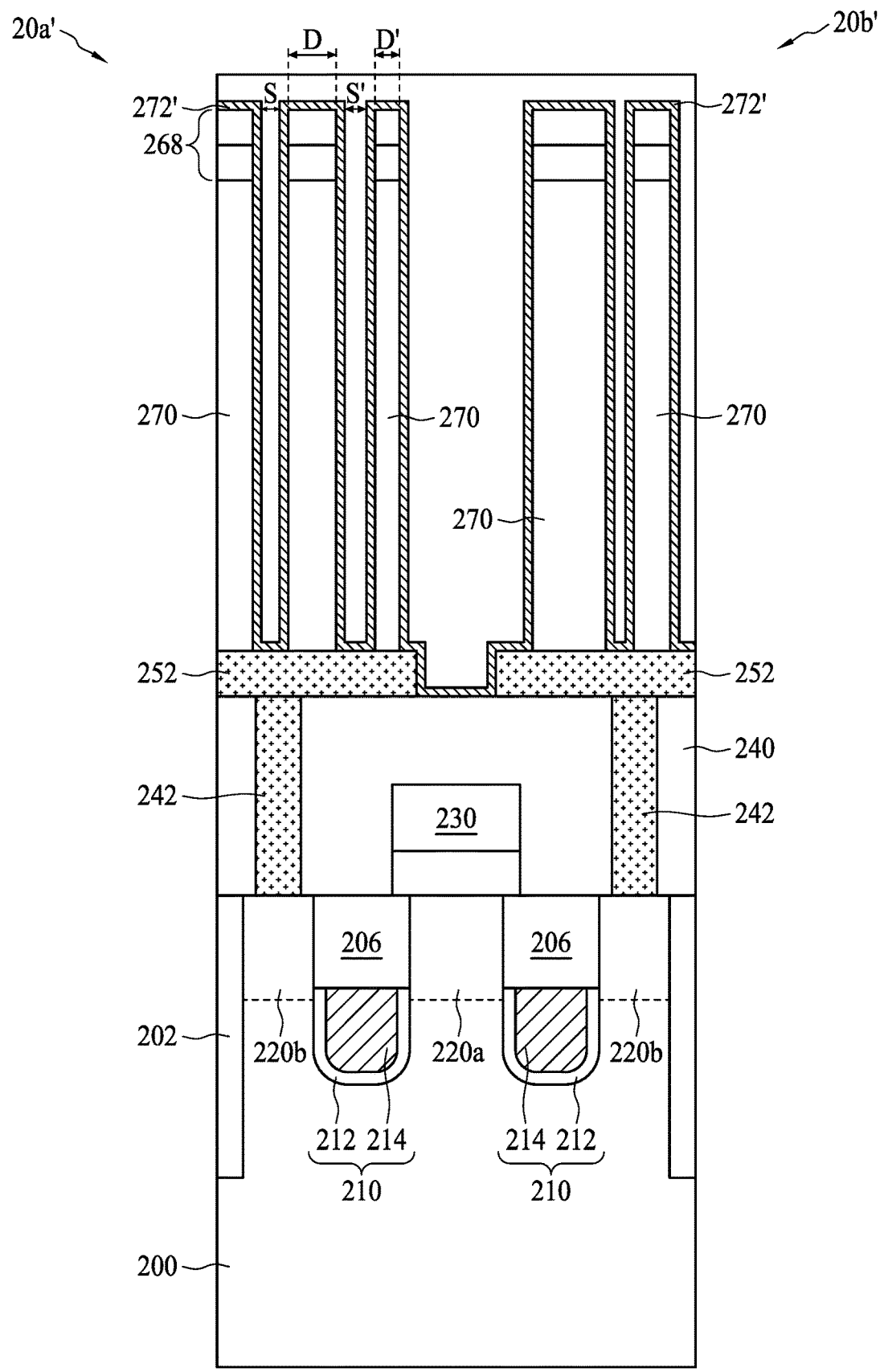

FIGS. 6A to 6C are schematic diagrams illustrating various fabrication stages constructed according to the method for preparing the DRAM cell structure 10b in accordance with the second embodiment of the present disclosure. It should be understood that similar features in the first and second embodiments can include similar materials, and thus such details are omitted in the interest of brevity. Further, those similar features are designated by the same numerals.

Referring to FIG. 6A, a substrate 200 is provided according to step 100 of the method 10b. An isolation structure 202, such as an STI structure, is formed in the substrate 200 for defining at least an active region 204. At least a gate structure, such as a buried gate structure 210, is disposed in the substrate 200 in the active region 204. As mentioned above, the buried gate structure 210 includes a dielectric layer 212 and a conductive layer 214. An isolation structure 206 is formed on the buried gate structure 210. A first source/drain region 220a and a second source/drain region 220b are formed in the active region 204 at two opposite sides of the buried gate structure 210. A bit line structure 230 is formed on the first source/drain region 220a. In some embodiments, a contact plug (not shown) can be formed between the bit line structure 230 and the second source/drain region 220a. A dielectric structure 240 is formed on the substrate 200. As shown in FIG. 6A, the dielectric structure 240 covers the bit line structure 230 and the substrate 200. In some embodiments, the dielectric structure 240 can be a single-layered structure. In other embodiments, the dielectric structure 240 can be a multi-layered structure.

Still referring to FIG. 6A, a contact plug 242 is formed in the dielectric structure 240. Further, the contact plug 242 is formed on the second source/drain region 220b for each MOSFET device. After the forming of the contact plugs 242, a first conductive layer 250 is formed over the substrate 200 according to step 101 of the method 10b. Further, the first conductive layer 250 is in contact with the contact plugs 242.

Next, portions of the first conductive layer 250 are removed according to step 102 of the method 10b. The portions of the first conductive layer 250 are removed to form a landing pad 252 directly on each of the contact plugs 242, as shown in FIG. 6A. However, the landing pads 252 are physically and electrically insulated from each other.

Next, a second conductive layer, a hard mask layer and an HSG layer 266 are sequentially formed on the first conductive layer (i.e., the landing pad 252) according to step 103 of the method 10b. In some embodiments, the hard mask layer can include a single-layer structure. In alternative embodiments, the hard mask layer can include a multi-layer structure. For example, the hard mask layer can include at least a first mask layer 264a and a second mask layer 264b, but the disclosure is not limited thereto.

Figure 9:
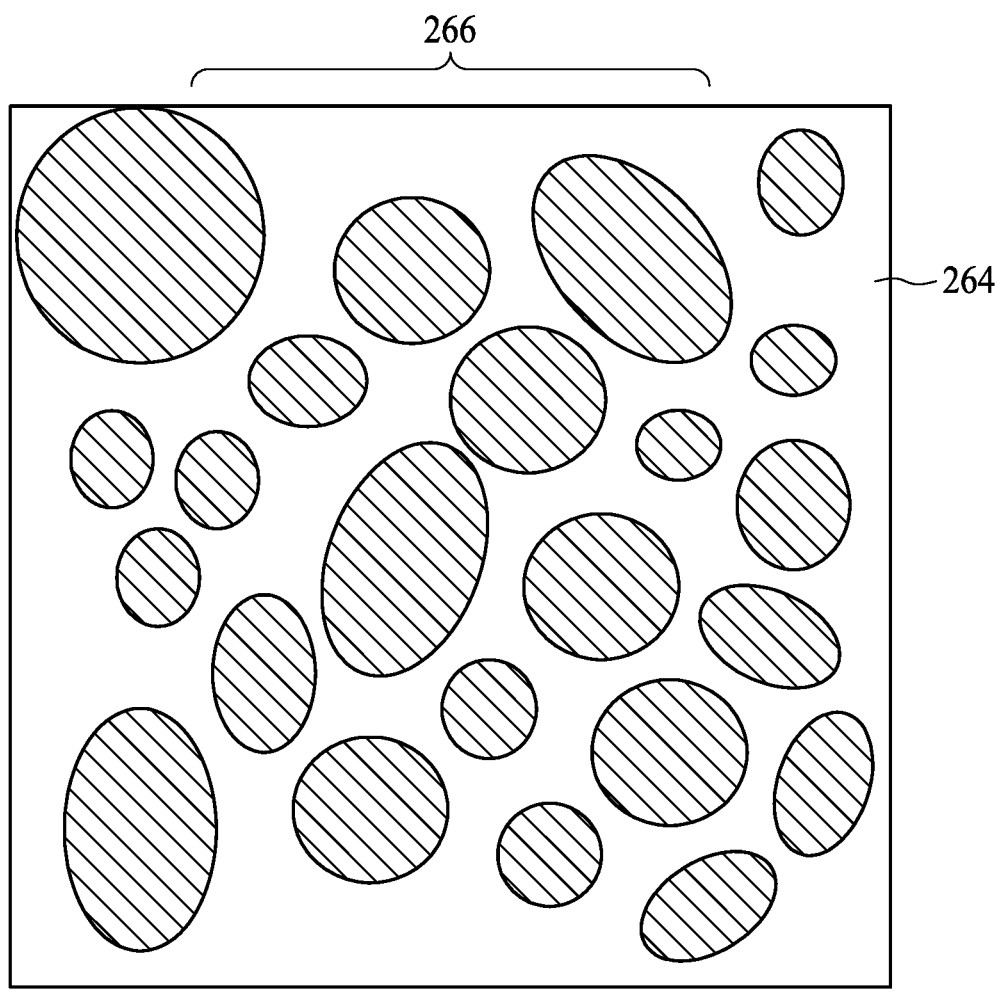
FIG. 9 is a top view of the HSG layer in accordance with some embodiments of the present disclosure.

As mentioned above, the HSG layer 266 can be an undoped hemispherical-grained silicon (HSG-Si) layer, but the disclosure is not limited thereto. Please refer to FIG. 9, which is a top view of the HSG layer 266 in accordance with some embodiments. In some embodiments, the HSG layer 266 can include a plurality of HSG-Si grains, and the HSG-Si grains in the HSG layer 266 can have a half-circular shape or a half-elliptical shape. In some embodiments, shapes of the HSG-Si grains in HSG layer 266 can be different. In some embodiments, a diameter of the HSG-Si grains in the HSG layer 266 can be different from each other, but the disclosure is not limited thereto. It should be noted that spacing distances between the adjacent HSG-Si grains in the HSG layer 266 are less than a minimum spacing distance that is achieved using photolithography techniques. It some embodiments, the spacing distances between the adjacent HSG-Si grains in the HSG layer 266 can be different, as shown in FIGS. 6A and 9.

Still referring to FIG. 6A, portions of the HSG layer 266 are removed according to step 104 of the method 10b. In some embodiments, several HSG-Si grains in the HSG layer 266 are removed. Accordingly, each of the remaining HSG-Si grains in the HSG layer 266 overlaps the landing pads 252, as shown in FIG. 6A. Next, the hard mask layer is patterned through the HSG layer 266 to form a hard mask pattern 268 on the second conductive layer 260, according to step 105 of the method 10b. Since the hard mask pattern 268 is obtained by transferring the HSG-Si grains in the HSG layer 266 to the hard mask layer, each feature in the hard mask pattern 268 inherits the diameter (or width) and the shape of the HSG-Si grain. Also, a spacing distance between adjacent features in the hard mask pattern 268 is the same as the spacing distance between adjacent HSG-Si grains, as shown in FIG. 6A. In some embodiments, the HSG layer 266 may be removed after the forming of the hard mask pattern 268, but the disclosure is not limited thereto.

The second conductive layer 260 is etched through the hard mask pattern 268 to form a plurality of conductive pillars 270 over the substrate 200 according to step 106 of the method 10b. As shown in FIG. 6A, the plurality of conductive pillars 270 are formed on the landing pad 252 and separated from each other. Since the plurality of conductive pillars 270 are obtained by etching the second conductive layer 260 through the hard mask pattern 268, and the hard mask pattern is obtained by transferring the HSG-Si grains in the HSG layer 266, a top surface of each of the plurality of conductive pillars 270 inherits the diameter (or width) and the shape of the HSG-Si grain. Also, a spacing distance between adjacent conductive pillars 270 is the same as the spacing distance between the adjacent HSG-Si grains, as shown in FIG. 6A. A height of each of the plurality of conductive pillars 270 is the same as the thickness of the second conductive layer 260.

Referring to FIG. 6B, a dielectric layer 272' is formed over the plurality of conductive pillars 270 according to step 108' of the method 10b. As shown in FIG. 6B, the dielectric layer 272' is conformally formed to cover top surfaces of the hard mask pattern 268 and sidewalls of the plurality of conductive pillars 270.

Referring to FIG. 6C, a third conductive layer 274 is formed on the dielectric layer 272' according to step 109 of the method 10b.

Accordingly, a DRAM cell structure 20a' or a DRAM cell structure 20b' is formed according to the method 10b. The difference between the DRAM cell structures 20a/20b and the DRAM cell structures 20a'/20b' is that sidewalls of the plurality of conductive pillars 270 of the DRAM cell structures 20a/20b and 20a'/20b' are in contact with the dielectric layer 272', but, in the DRAM cell structures 20a'/20b', top surfaces of the plurality of conductive pillars 270 are separated from the dielectric layer 272' by the hard mask pattern 268.

According to the DRAM cell structure 20a' or 20b' provided by the second preferred embodiments, each of the conductive pillars 270 on each landing pad 252 may have different widths D/D' or shapes, and the spacing distances S/S' between adjacent conductive pillars 270 on each landing pad 252 may be different from each other. Further, the top surface of each of the plurality of conductive pillars 270 may have a circular or elliptical shape, which is inherited from the HSG-Si grains, and thus each of the plurality of conductive pillars 270 may be a cylinder. Accordingly, surface area of each of the plurality of conductive pillars 270 is increased, and capacitance of the capacitor in the DRAM memory cells 20a' and 20b' is thereby increased. In addition, since the step of removing the hard mask pattern 268 is not performed in the second preferred embodiments, the manufacturing method is further simplified.

Figure 7A:
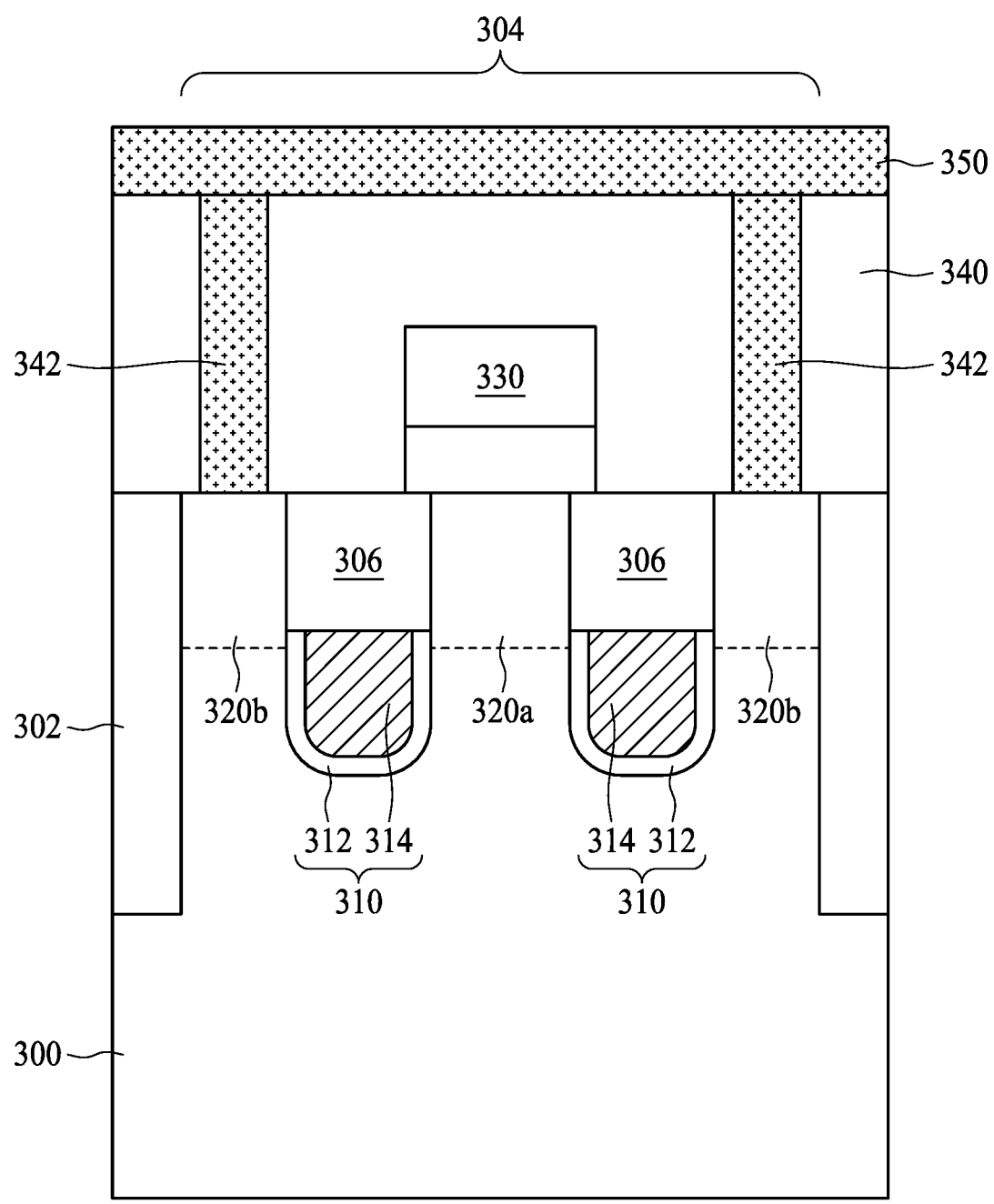
FIGS. 7A to 7H are schematic diagrams illustrating various fabrication stages of the method for preparing the DRAM cell structure in accordance with the third embodiment of the present disclosure.

FIGS. 7A to 7H are schematic diagrams illustrating various fabrication stages constructed in according to the method for preparing the DRAM cell structure 12a accordance with the third embodiment of the present disclosure. It should be understood that similar features in the first and third embodiments can include similar materials, and thus such details are omitted in the interest of brevity. Referring to FIG. 7A, a substrate 300 is provided according to step 120 of the method 12a. A well region (not shown) may be formed in the substrate 300. The well region may be neutral, or may be an n-type or p-type doped region, depending on the conductivity type of the transistor structure formed thereafter. An isolation structure 302, such as an STI structure, is formed in the substrate 300 for defining at least an active region 304.

Still referring to FIG. 7A, at least a gate structure 310 is subsequently disposed in the substrate 300 in the active region 304. In some embodiments, the gate structure 310 can be a buried gate structure, but the disclosure is not limited thereto. In some embodiments, two buried gate structures 310 can be formed in one active region 304, as shown in FIG. 7A, but the disclosure is not limited thereto. Each of the buried gate structures 310 can include a dielectric layer 312 and a conductive layer 314. An isolation structure 306 is formed on the buried gate structures 310. As shown in FIG. 7A, a top surface of the buried gate structure 310 is lower than a surface of the substrate 300 or lower than a top surface of the isolation structure 302.

Next, a first source/drain region 320a and a second source/drain region 320b are formed in the active region 304 at two opposite sides of the buried gate structure 310. The first and second source/drain regions 320a and 320b include an n-type or a p-type doped region, depending on the conductivity type of the transistor structure to be formed. In some embodiments, the first source/drain region 320a can be formed between the pair of buried gate structures 310, as shown in FIG. 7A. That is, the two buried gate structures 310 share one first source/drain region 320a. Accordingly, each buried gate structure 310 and the first and second source/drain regions 320 and 320b adjacent thereto may constitute a MOSFET device, which serves as a cell selection element. Further, because the buried gate structure 310 may have a three-dimensional structure, a channel length of the channel region may be increased, and a short-channel effect may be reduced.

Referring to FIG. 7A, a bit line structure 330 is formed on the first source/drain region 320a. In some embodiments, a contact plug (not shown) can be formed between the bit line structure 330 and the first source/drain region 320a. After the forming of the bit line structure 330, a dielectric structure 340 is formed on the substrate 300. As shown in FIG. 7A, the dielectric structure 340 covers the bit line structure 330 and the substrate 300. In some embodiments, the dielectric structure 340 can be a single-layered structure. In other embodiments, the dielectric structure 340 can be a multi-layered structure.

Still referring to FIG. 7A, a contact plug 342 is formed in the dielectric structure 340. Further, the contact plug 342 is formed on the second source/drain region 320b for each MOSFET device. After the forming of the contact plugs 342, a first conductive layer 350 is formed over the substrate 300 according to step 121 of the method 12a. As shown in FIG. 7A, the first conductive layer 350 is formed to completely cover the dielectric structure 340 and the contact plugs 342. Further, the first conductive layer 350 is in contact with the contact plugs 342.

Figure 7B:
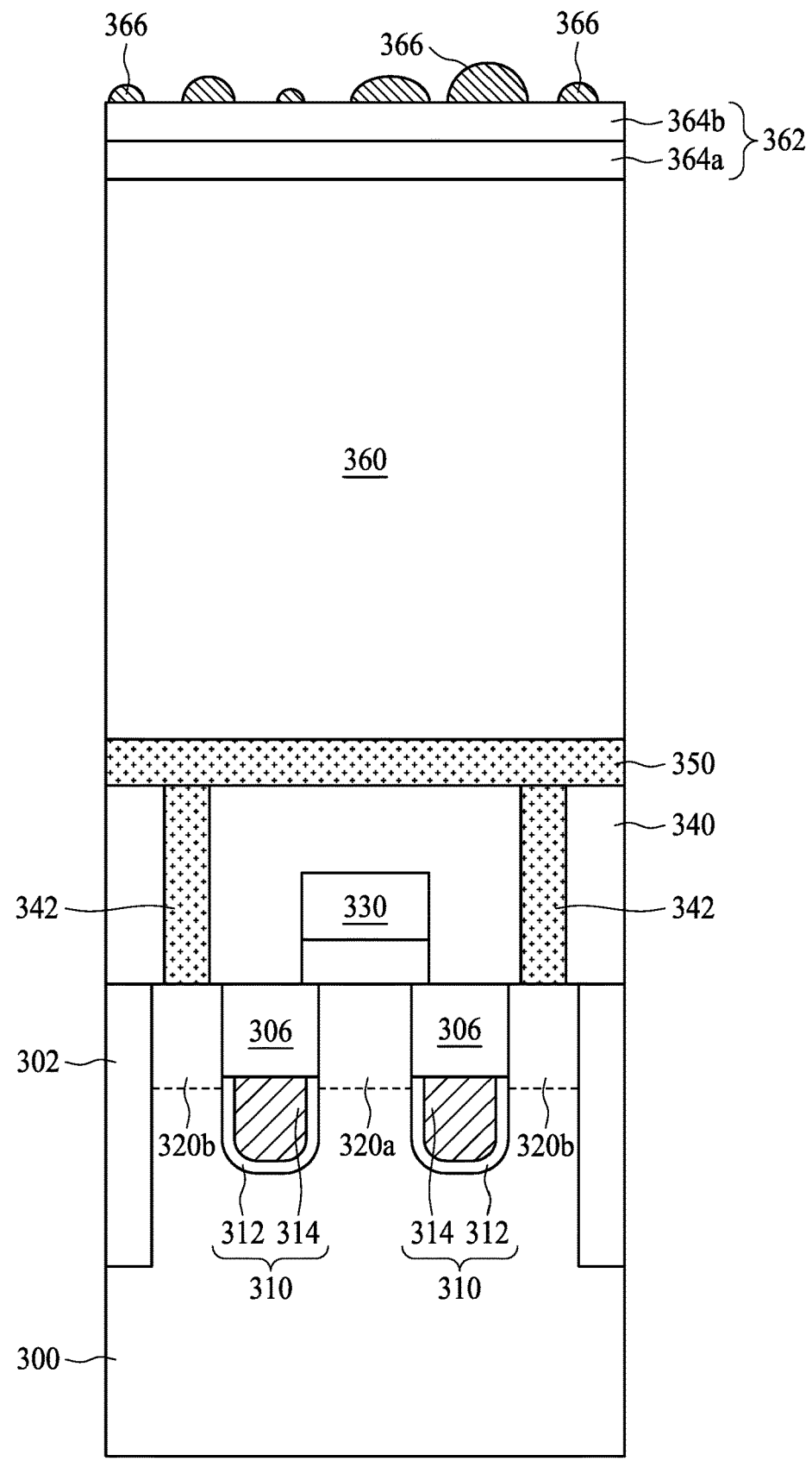

Referring to FIG. 7B, a second conductive layer 360, a hard mask layer 362 and an HSG layer 366 are sequentially formed on the first conductive layer 350 according to step 122 of the method 12a. In some embodiments, the hard mask layer 362 can include a single-layered structure. In alternative embodiments, the hard mask layer 362 can include a multi-layered structure. For example, the hard mask layer 262 can include at least a first mask layer 364a and a second mask layer 364b, but the disclosure is not limited thereto.

Still referring to FIG. 7B, the HSG layer 366 is formed on the hard mask layer 362. In some embodiments, the HSG layer 366 can be an undoped hemispherical-grained silicon (HSG-Si) layer. Also referring to FIG. 9, in some embodiments, the HSG-Si grains in the HSG layer 366 can have a half-circular shape or a half-elliptical shape. In some embodiments, shapes of the HSG-Si grains in the HSG layer 366 can be different from each other, but the disclosure is not limited thereto. In some embodiments, diameters of the HSG-Si grains in the HSG layer 366 can be different from each other, but the disclosure is not limited thereto. In some embodiments, spacing distances between adjacent HSG-Si grains in the HSG layer 366 can be different from each other, but the disclosure is not limited thereto. It should be noted that the spacing distance between the adjacent HSG-Si grains in the HSG layer 366 is less than a minimum spacing distance that is achieved using photolithography techniques.

Figure 7C:
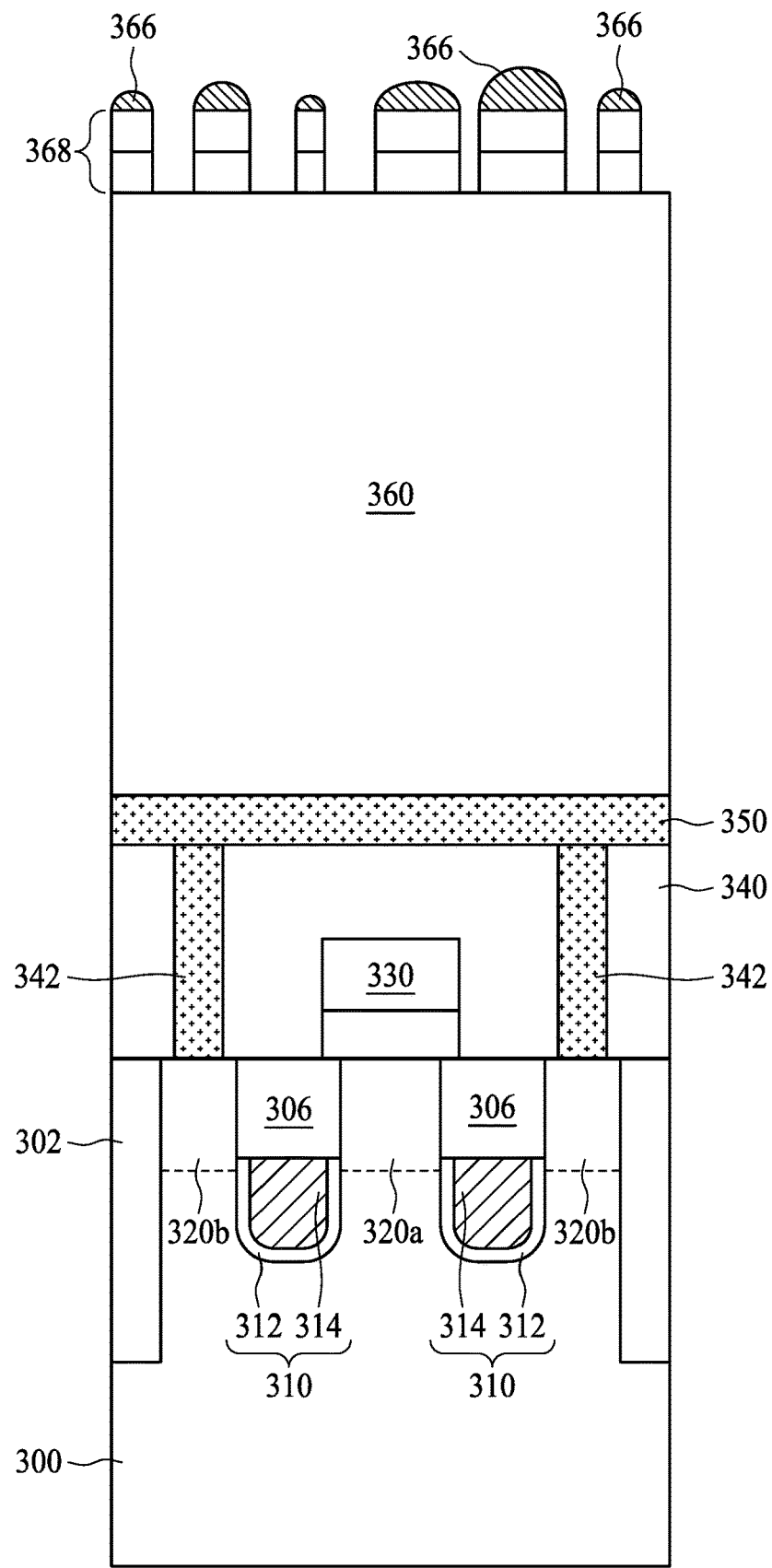

Referring to FIG. 7C, the hard mask layer 362 is patterned through the HSG layer 366 to form a hard mask pattern 368 on the second conductive layer 360, according to step 123 of the method 12a. Since the hard mask pattern 368 is obtained by transferring the HSG-Si grains in the HSG layer 366 to the hard mask layer 362, each feature in the hard mask pattern 368 inherits the diameter (or width) and the shape of the HSG-Si grain. Also, a spacing distance between adjacent features in the hard mask pattern 368 is the same as the spacing distance between the adjacent HSG-Si grains, as shown in FIGS. 7C and 9. In some embodiments, the HSG layer 366 may be removed after the forming of the hard mask pattern 368, but the disclosure is not limited thereto.

Figure 7D:
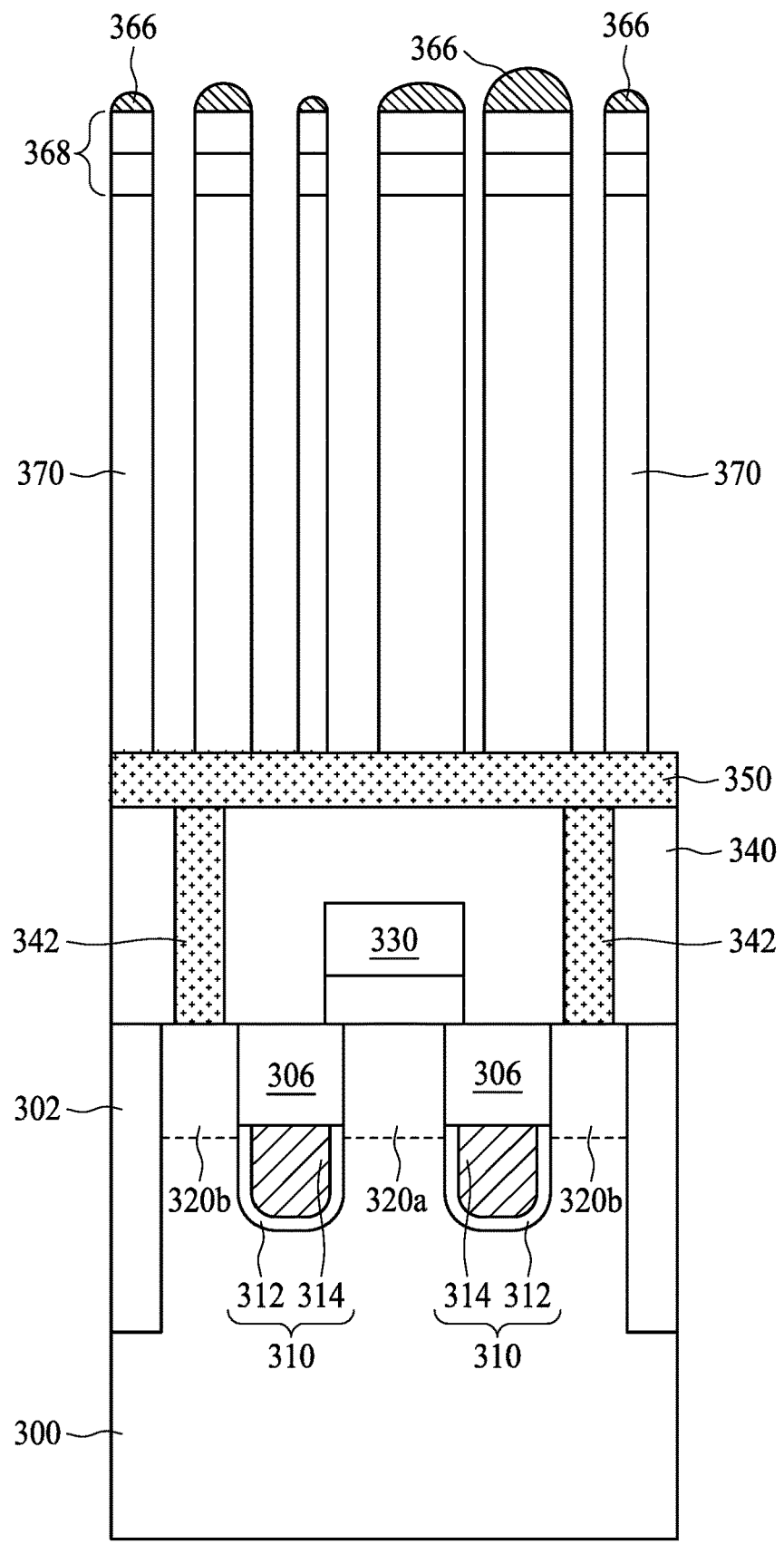

Referring to FIG. 7D, the second conductive layer 360 is etched through the hard mask pattern 368 to form a plurality of conductive pillars 370 over the substrate 300 according to step 124 of the method 12a. As shown in FIG. 7D, the plurality of conductive pillars 370 are formed on the first conductive layer 350 and separated from each other. Since the plurality of conductive pillars 370 are obtained by etching the second conductive layer 360 through the hard mask pattern 368, and the hard mask pattern 368 is obtained by transferring the HSG-Si grains in the HSG layer 366, a top surface of each of the plurality of conductive pillars 370 inherits the diameter (or width) and the shape of the HSG-Si grain. Also, a spacing distance between adjacent conductive pillars 370 is the same as the spacing distance between the adjacent HSG-Si grains, as shown in FIG. 7D. A height of each of the plurality of conductive pillars 370 is the same as the thickness of the second conductive layer 360.

Figure 7E:
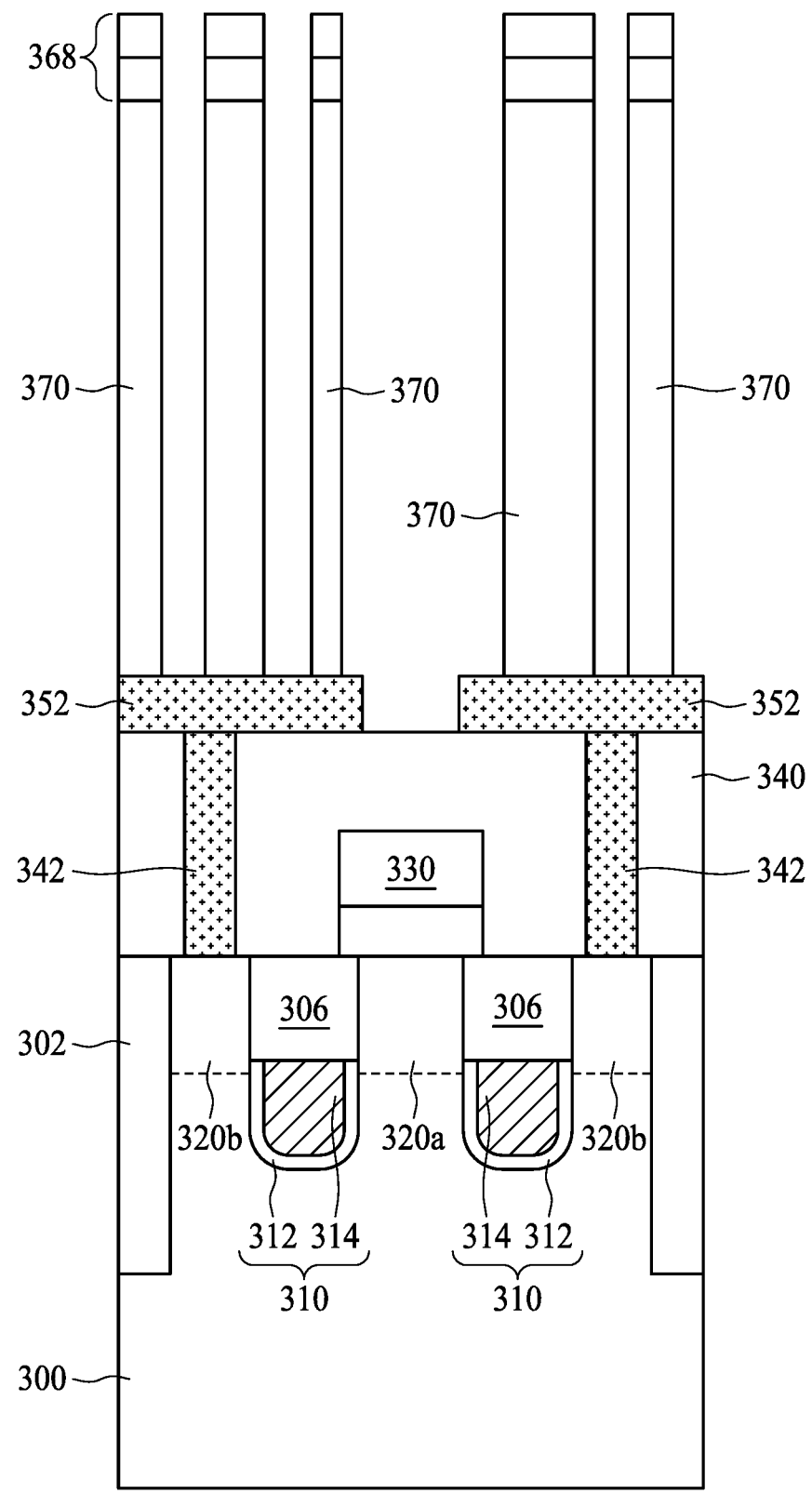

Referring to FIG. 7E, several of the plurality of conductive pillars 370 are removed according to step 125 of the method 12a. Further, portions of the first conductive layer 350 are removed according to step 125 of the method 12a. Consequently, a landing pad 352 directly on each of the contact plugs 342 is obtained, as shown in FIG. 7E. The landing pads 352 are physically and electrically insulated from each other. In some embodiments, a patterned sacrificial layer (not shown) can be formed over the plurality of conductive pillars 370 and the first conductive layer 350, and the several of the plurality of conductive pillars 370 and the portions of the first conductive layer 350 that are exposed through the patterned sacrificial layer are removed. In some embodiments, the sacrificial layer is patterned using a photomask that is used to define dimensions and locations of the landing pads 352, but the disclosure is not limited thereto. The several of the plurality of conductive pillars 370 exposed through the patterned sacrificial layer may be defined as dummy and unnecessary pillars. Next, those unnecessary pillars and the portions of the first conductive layer 350 are removed. Additionally, the patterned sacrificial layer is removed after the removing of the portions of the several of the plurality of conductive pillars 370 and the forming of the landing pad 352. It should be noted that since the removing of several of the plurality of conductive pillars 370 and the forming of the landing pad 352 can be simultaneously performed, the manufacturing process is further simplified in accordance with the third embodiment.

Figure 7F:
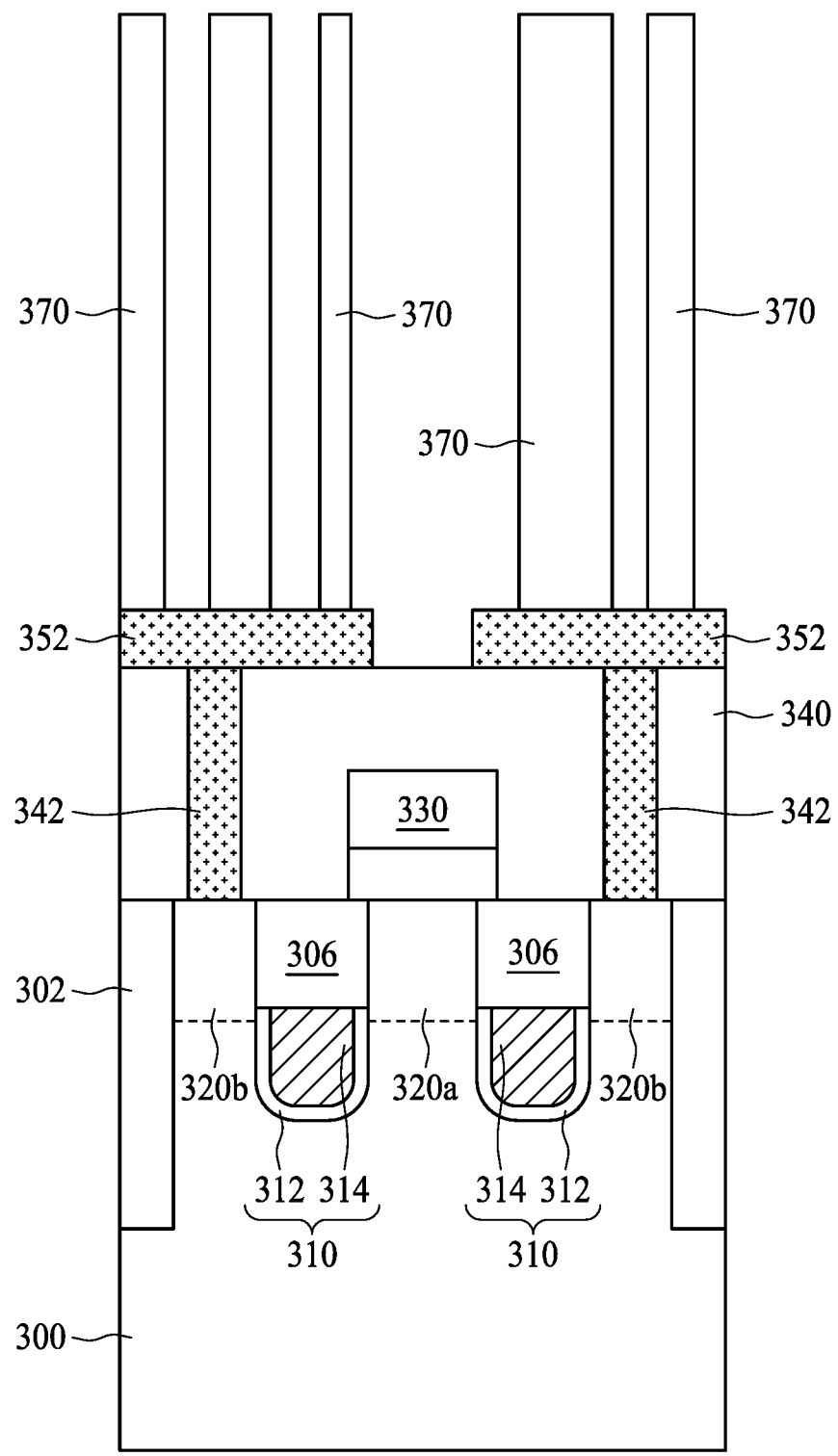

Referring to FIG. 7F, the hard mask pattern 368 is removed according to step 126 of the method 12a. Accordingly, the top surface and sidewalls of each of the plurality of conductive pillars 370 are exposed, and portions of the landing pad 352 are exposed, as shown in FIG. 7F.

Figure 7G:
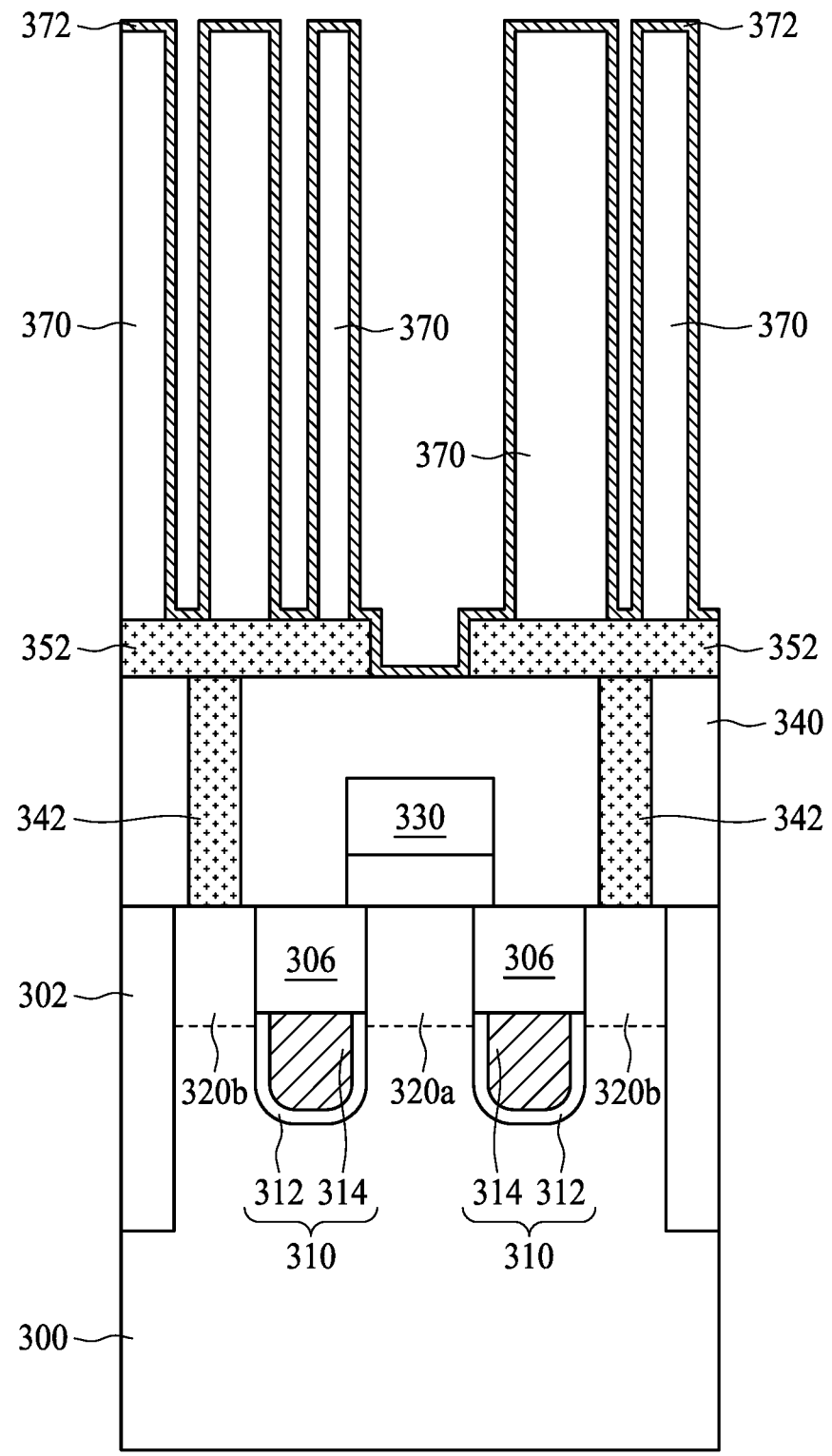

Referring to FIG. 7G, a dielectric layer 372 is formed over the plurality of conductive pillars 370 according to step 127 of the method 12a. As shown in FIG. 7G, the dielectric layer 372 is conformally formed to cover the top surfaces and sidewalls of the plurality of conductive pillars 370.

Figure 7H:
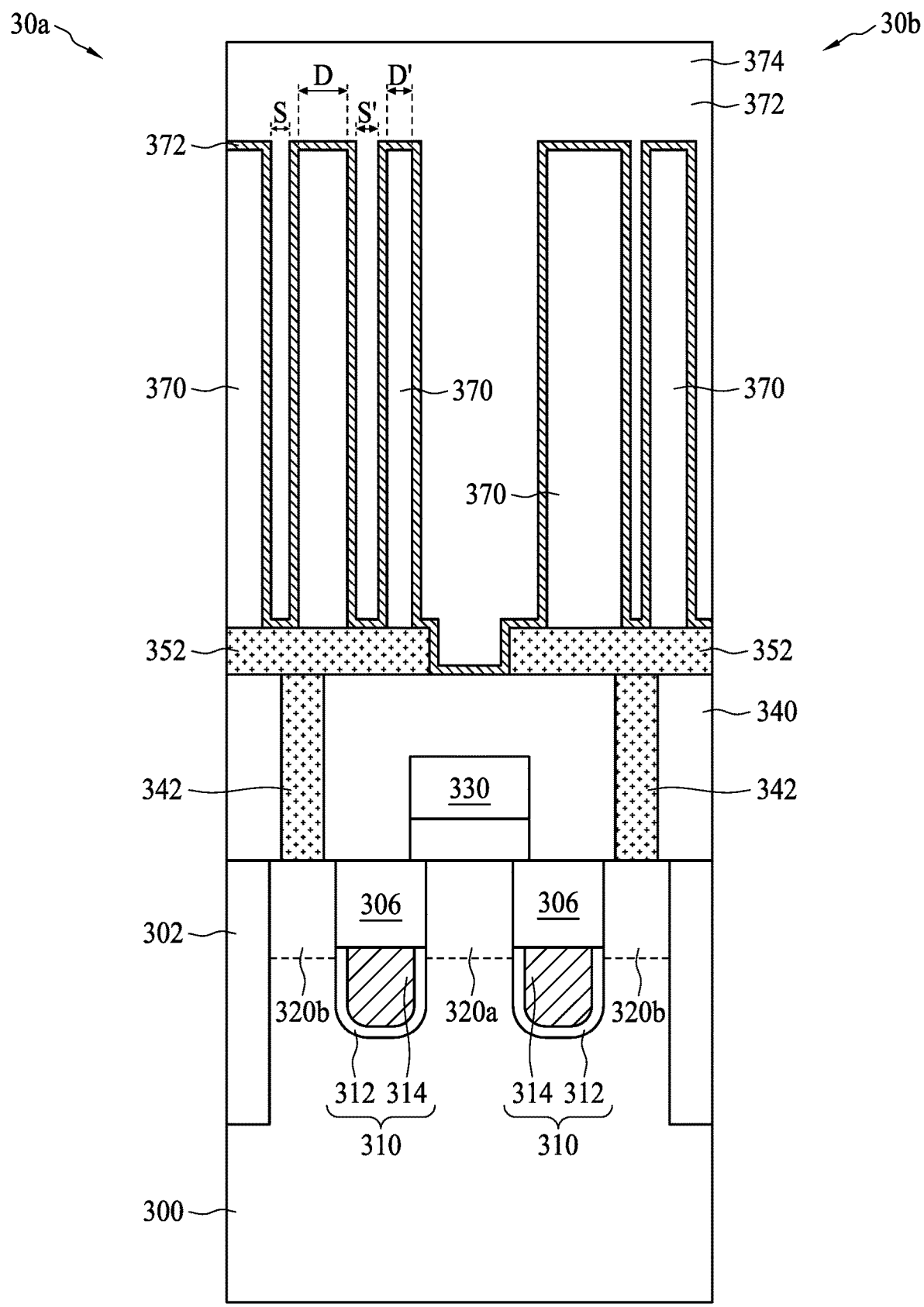

Referring to FIG. 7H, a third conductive layer 374 is formed on the dielectric layer 372 according to step 128 of the method 12a.

Accordingly, a DRAM cell structure 30a or a DRAM cell structure 30b is formed according to the method 12a. The DRAM cell structures 30a and 30b respectively include the substrate 300, the gate structure 310 (i.e., the buried gate structure 310) disposed in the substrate 300, the first source/drain region 320a and the second source/drain region 320b disposed in the substrate 300 at two sides of the buried gate structure 310, the bit line structure 330 disposed on the first source/drain region 320a, the landing pad 352 disposed over the second source/drain region 320b, the contact plug 342 disposed on the second source/drain region 320b for electrically connecting the landing pad 352 and the second source/drain region 320b, the plurality of conductive pillars 370 disposed on the landing pad 352, the third conductive layer 374 disposed over the plurality of conductive pillars 370, and the dielectric layer 372 disposed between the plurality of conductive pillars 370 and the third conductive layer 374. Further, the DRAM cell structure 30a and the DRAM cell structure 30b include the dielectric structure 340. The dielectric structure 340 covers the bit line structure 330, and the contact plug 342 is formed within the dielectric structure 340. As shown in FIG. 7H, an extending direction of the plurality of conductive pillars 370 is substantially perpendicular to a surface of the substrate 300, but the disclosure is not limited thereto.

As shown in FIG. 7H, the plurality of conductive pillars 370 on each landing pad 352 have at least a first width D and a second width D', and the first width D and the second width D' are different from each other. In some embodiments, the plurality of conductive pillars 370 on each landing pad are separated from each other by at least a first spacing distance S and a second spacing distance S', and the first spacing distance S and the second spacing distance S' are different from each other. In some embodiments, the plurality of conductive pillars 370 on each landing pad 352 have at least a first shape and a second shape, and the first shape and the second shape are different from each other. In some embodiments, the top surfaces and the sidewalls of the plurality of conductive pillars 370 are in contact with the dielectric layer 372.

According to the DRAM cell structure 30a or 30b provided by the preferred embodiments, the conductive pillars 370 on each landing pad 352 may have different widths or shapes, and the spacing distances between adjacent pairs of conductive pillars 370 on each landing pad 352 may be different from each other. It should be noted that because the HSG-Si grains in the HSG layer 366, which is used to define dimensions and locations of the plurality of conductive pillars 370, are separately formed without extra photolithography, the manufacturing method can be simplified. Further, the top surface of each of the plurality of conductive pillars 370 may have a circular or elliptical shape, which is inherited from the HSG-Si grains, and thus each of the plurality of conductive pillars 370 may be a cylinder. Accordingly, a surface area of each of the plurality of conductive pillar 370 is increased, and capacitance of the capacitor in the DRAM memory cells 30a and 30b is therefore increased.

FIGS. 8A to 8D are schematic diagrams illustrating various fabrication stages constructed according to the method for preparing the DRAM cell structure 12b in accordance with the fourth embodiment of the present disclosure. It should be understood that similar features in the third and fourth embodiments can include similar materials, and thus such details are omitted in the interest of brevity. Further, those similar features are designated by the same numerals.

Figure 8A:
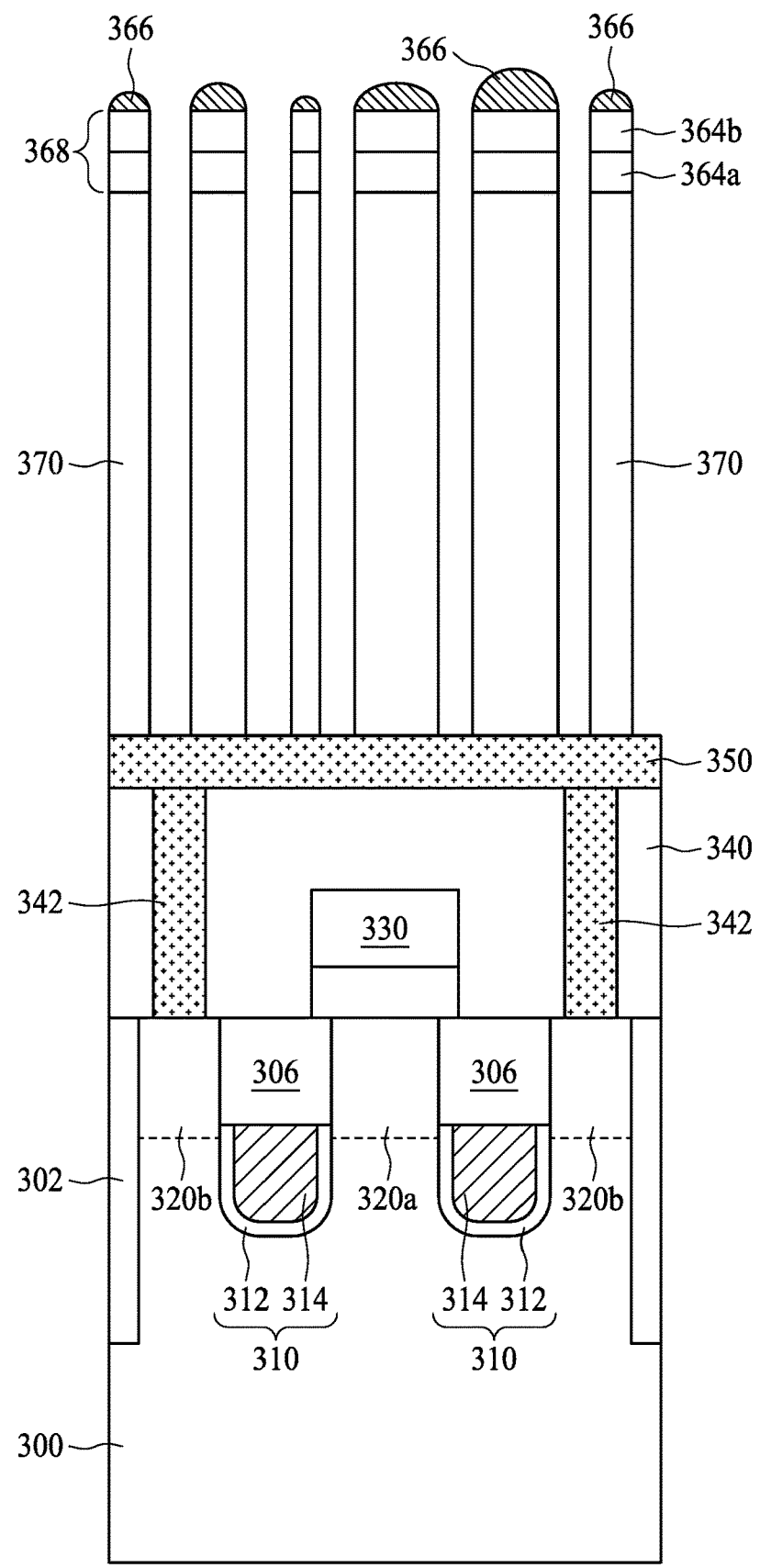
FIGS. 8A to 8D are schematic diagrams illustrating various fabrication stages of the method for preparing the DRAM cell structure in accordance with the fourth embodiment of the present disclosure.

Referring to FIG. 8A, a substrate 300 is provided according to step 120 of the method 12b. An isolation structure 302, such as an STI structure, is formed in the substrate 300 for defining at least an active region 304. At least a gate structure, such as a buried gate structure 310, is disposed in the substrate 300 in the active region 304. As mentioned above, the buried gate structure 310 includes a dielectric layer 312 and a conductive layer 314. An isolation structure 306 is formed on the buried gate structure 310. A first source/drain region 320a and a second source/drain region 320b are formed in the active region 304 at two opposite sides of the gate structure 310. A bit line structure 330 is formed on the first source/drain region 320a. In some embodiments, a contact plug (not shown) can be formed between the bit line structure 330 and the first source/drain region 320a. A dielectric structure 340 is formed on the substrate 300. As shown in FIG. 8A, the dielectric structure 340 covers the bit line structure 330 and the substrate 300.

Still referring to FIG. 8A, a contact plug 342 is formed in the dielectric structure 340. Further, the contact plug 342 is formed on the second source/drain region 320b for each MOSFET device. After the forming of the contact plugs 342, a first conductive layer 350 is formed over the substrate 300 according to step 121 of the method 12b. Further, the first conductive layer 350 is in contact with the contact plugs 342.

Next, a second conductive layer, a hard mask layer and an HSG layer 366 are sequentially formed on the first conductive layer 352 according to step 122 of the method 12b. In some embodiments, the hard mask layer can include a single-layered structure. In alternative embodiments, the hard mask layer can include a multi-layered structure. For example, the hard mask layer can include at least a first mask layer 364a and a second mask layer 364b, but the disclosure is not limited thereto.

Still referring to FIG. 8A, the HSG layer 366 can be an undoped hemispherical-grained silicon (HSG-Si) layer. Also referring to FIG. 9, in some embodiments, the HSG-Si grains in the HSG layer 366 can have a half-circular shape or a half-elliptical shape. In some embodiments, the shapes of the HSG-Si grains in the HSG layer 366 can be different from each other, but the disclosure is not limited thereto. In some embodiments, a diameter of the HSG-Si grains in the HSG layer 366 can be different from each other, but the disclosure is not limited thereto. In some embodiments, spacing distances between adjacent pairs of HSG-Si grains in the HSG layer 366 can be different from each other, but the disclosure is not limited thereto. It should be noted that the spacing distance between the adjacent HSG-Si grains in the HSG layer 366 is less than a minimum spacing distance that is achieved using photolithography techniques.

Next, the hard mask layer is patterned through the HSG layer 366 to form a hard mask pattern 368 on the second conductive layer 360, according to step 123 of the method 12b. Since the hard mask pattern 368 is obtained by transferring the HSG-Si grains in HSG layer 366 to the hard mask layer, each feature in the hard mask pattern 368 inherits the diameter (or width) and the shape of the HSG-Si grain. Also, a spacing distance between adjacent features in the hard mask pattern 368 is the same as the spacing distance between adjacent HSG-Si grains, as shown in FIG. 8A. In some embodiments, the HSG layer 366 may be removed after the forming of the hard mask pattern 368, but the disclosure is not limited thereto.

The second conductive layer is then etched through the hard mask pattern 368 to form a plurality of conductive pillars 370 over the substrate 300 according to step 124 of the method 12b. As shown in FIG. 8A, the plurality of conductive pillars 370 are formed on the first conductive layer 350 and separated from each other. Since the plurality of conductive pillars 370 are obtained by etching the second conductive layer through the hard mask pattern 368, and the hard mask pattern 368 is obtained by transferring the HSG-Si grains in the HSG layer 366, a top surface of each of the plurality of conductive pillars 370 inherits the diameter (or width) and the shape of the HSG-Si grain. Also, a spacing distance between adjacent conductive pillars 370 is the same as the spacing distance between the adjacent HSG-Si grains, as shown in FIG. 8A. A height of each of the plurality of conductive pillars 370 is the same as the thickness of the second conductive layer.

Figure 8B:
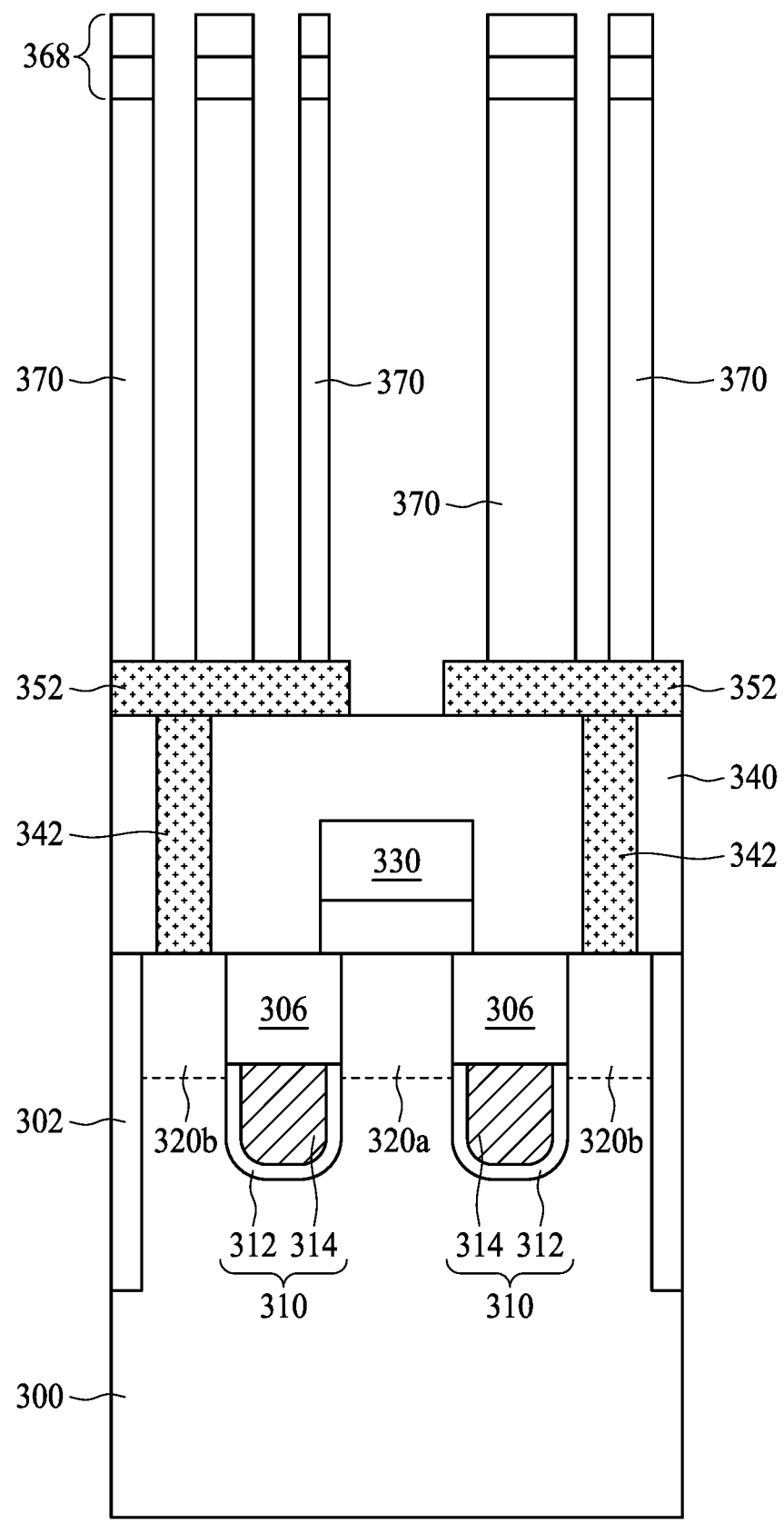

Referring to FIG. 8B, several of the plurality of conductive pillars 370 are removed according to step 125 of the method 12b. Further, portions of the first conductive layer 350 are removed according to step 125 of the method 12b. Consequently, a landing pad 352 directly on each of the contact plugs 342 is obtained, as shown in FIG. 8B. The landing pads 352 are physically and electrically insulated from each other. The steps for the removing of the several of the plurality of conductive pillars 370 and the portions of the first conductive layer 350 can be similar to the steps described above, and therefore such details are omitted for brevity. It should be noted that since the removing of several of the plurality of conductive pillars 370 and the forming of the landing pad 352 can be simultaneously performed, the manufacturing process is further simplified in accordance with the fourth embodiment.

Figure 8C:
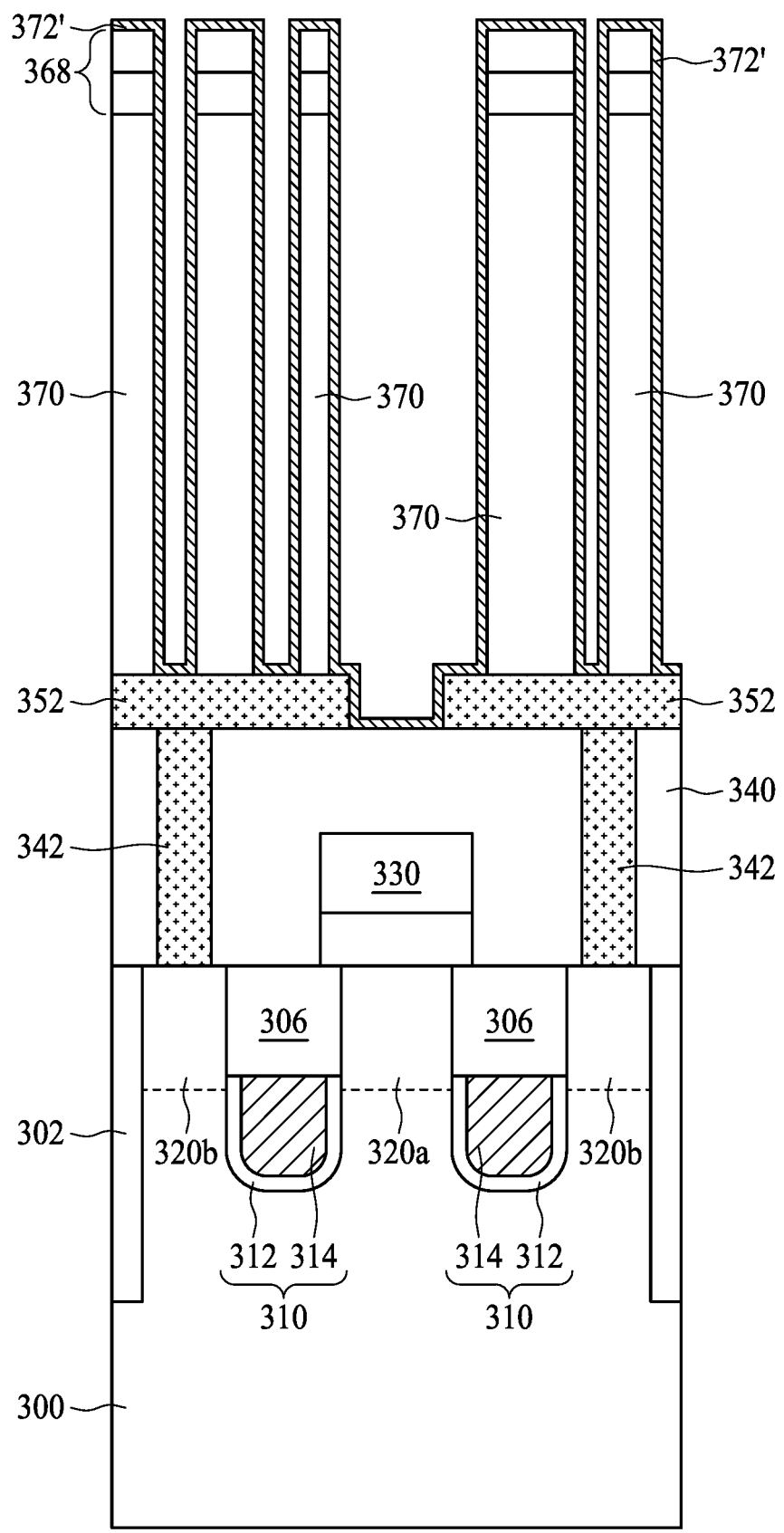

Referring to FIG. 8C, a dielectric layer 372' is formed over the plurality of conductive pillars 370 according to step 127' of the method 12b. As shown in FIG. 8C, the dielectric layer 372' is conformally formed to cover the top surfaces of the hard mask pattern 368 and sidewalls of the plurality of conductive pillars 370.

Figure 8D:
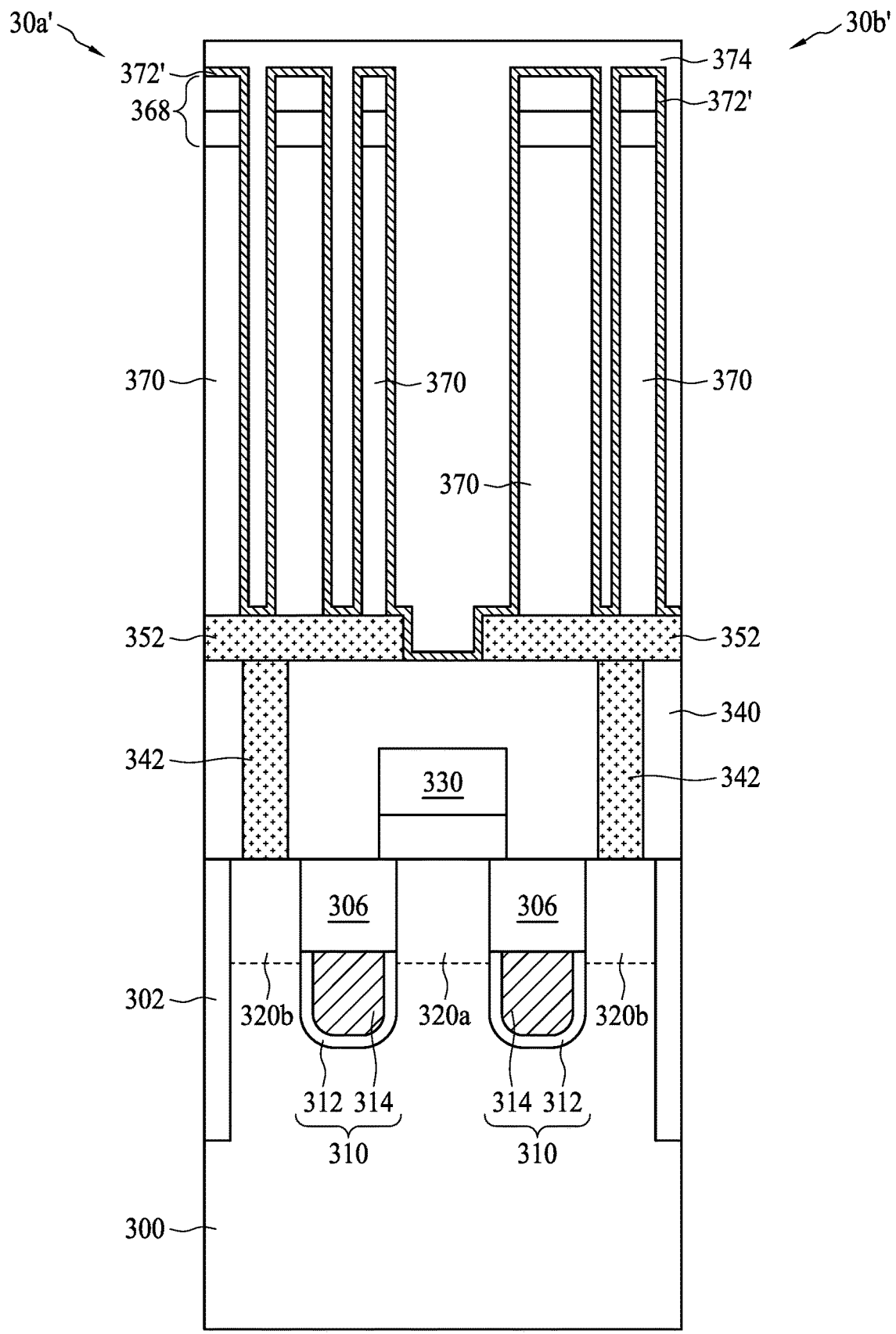

Referring to FIG. 8D, a third conductive layer 374 is formed on the dielectric layer 372' according to step 128 of the method 12b.

Accordingly, a DRAM cell structure 30a' or a DRAM cell structure 30b' is formed according to the method 12b. The difference between the DRAM cell structures 30a/30b and the DRAM cell structures 30a'/30b' is that the sidewalls of the plurality of conductive pillars 370 of the DRAM cell structures 30a/30b and the DRAM cell structures 30a'/30b' are in contact with the dielectric layer 372', but, in the DRAM cell structures 30a'/30b', top surfaces of the plurality of conductive pillars 370 are separated from the dielectric layer 372' by the hard mask pattern 368.

According to the method 12b for forming the DRAM cell structure 30a' or 30b', since the forming of the landing pad 352 and the removing of the unnecessary conductive pillars 370 are performed simultaneously, the manufacturing processes can be further simplified. Further, the top surface of each conductive pillars 370 may have a circular or elliptical shape, which is inherited from the HSG-Si grains, and thus each of the plurality of conductive pillars 370 may be a cylinder. Accordingly, a surface area of each of the plurality of conductive pillars 370 is increased, and a capacitance of the capacitor in the DRAM memory cell 30a' and 30b' is thereby increased. In addition, since the step of removing the hard mask pattern 368 is not performed in the fourth preferred embodiments, the manufacturing method is further simplified.

In the present disclosure, the HSG layers 266 and 366 are formed on the hard mask layers 262 and 362 to define dimensions and locations of the plurality of conductive pillars 270 and 370 which are used to form a bottom electrode of a capacitor in a DRAM memory cell. The hard mask layers 262 and 362 are then patterned through the HSG layers 266 and 366 to form the hard mask patterns 268 and 368, and the plurality of conductive pillars 270 and 370 are formed by etching the second conductive layers 260 and 360 through the hard mask patterns 268 and 368. It should be noted that because the HSG layers 266 and 366 include features (i.e., the HSG-Si grains) that are separately formed without extra photolithography, the manufacturing method can be simplified. Further, a top surface of each of the conductive pillars 270 and 370 may have a circular or elliptical shape, which is inherited from the HSG layers 266 and 366, and thus each of the plurality of conductive pillars 270 and 370 may be a cylinder. Accordingly, a surface area of each of the plurality of conductive pillars 270 and 370 is increased, and a capacitance of the capacitor in the DRAM memory cell is thereby increased.

In contrast, with a comparative method applied without forming the HSG layer, photolithography and etching processes are required to define dimensions and locations of the conductive pillars. The comparative method therefore is complicated, and cost is greater than with the methods disclosed herein.

One aspect of the present disclosure provides a DRAM cell structure. The DRAM cell structure includes a substrate, a gate structure disposed in the substrate, a first source/drain region and a second source/drain region disposed in the substrate respectively at two sides of the gate structure, a landing pad disposed over the second source/drain region, a plurality of conductive pillars disposed on the landing pad, a conductive layer disposed over the plurality of conductive pillars, and a dielectric layer disposed between the conductive layer and the plurality of conductive pillars. In some embodiments, the plurality of conductive pillars have at least a first width and a second width, and the first width and the second width are different from each other.

Another aspect of the present disclosure provides a method for preparing a DRAM cell structure. The method includes the following steps. A substrate is provided. The substrate includes at least an active region, at least a gate structure disposed in the active region, and a first source/drain region and a second source/drain region disposed in the active region at two sides of the gate structure. A first conductive layer is formed over the substrate. A second conductive layer and a hard mask layer are sequentially formed on the first conductive layer. A hemispherical-grained (HSG) layer is formed on the hard mask layer. The hard mask layer is patterned through the HSG layer to form a hard mask pattern on the second conductive layer. The second conductive layer is etched through the hard mask pattern to form a plurality of conductive pillars over the substrate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a DRAM cell structure, comprising:
    providing a substrate comprising at least an active region, at least a gate structure disposed in the active region, and a first source/drain region and a second source/drain region disposed in the active region at two sides of the gate structure;
    forming a first conductive layer over the substrate;
    removing portions of the first conductive layer to form a landing pad before forming a second conductive layer;
    forming the second conductive layer and a hard mask layer on the first conductive layer, sequentially;
    forming a hemispherical-grained (HSG) layer on the hard mask layer;
    patterning the hard mask layer through the HSG layer to form a hard mask pattern on the second conductive layer;
    etching the second conductive layer through the hard mask pattern to form a plurality of conductive pillars over the substrate.

2. The method of claim 1, further comprising removing portions of the HSG layer before the patterning of the hard mask layer.

3. The method of claim 1, wherein the plurality of conductive pillars have at least a first width and a second width, and the first width and the second width are different from each other.

4. The method of claim 1, wherein the plurality of conductive pillars are separated from each other by at least a first spacing distance and a second spacing distance, and the first spacing distance and the second spacing distance are different from each other.

5. The method of claim 1, wherein the plurality of conductive pillars have at least a first shape and a second shape, and the first shape and the second shape are different from each other.

6. The method of claim 1, further comprising:
    forming a dielectric structure over the substrate; and
    forming a contact plug in the dielectric structure,
    wherein the contact plug electrically connects the second source/drain region and the first conductive layer.

7. A method for preparing a DRAM cell structure, comprising:
    providing a substrate comprising at least an active region, at least a gate structure disposed in the active region, and a first source/drain region and a second source/drain region disposed in the active region at two sides of the gate structure;
    forming a first conductive layer over the substrate;
    forming a second conductive layer and a hard mask layer on the first conductive layer, sequentially;
    forming a hemispherical-grained (HSG) layer on the hard mask layer;
    patterning the hard mask layer through the HSG layer to form a hard mask pattern on the second conductive layer;
    etching the second conductive layer through the hard mask pattern to form a plurality of conductive pillars over the substrate;
    removing several of the plurality of conductive pillars; and
    removing portions of the first conductive layer to form a landing pad simultaneously with the removing of the several of the plurality of conductive pillars.

8. A method for preparing a DRAM cell structure, comprising:
    providing a substrate comprising at least an active region, at least a gate structure disposed in the active region, and a first source/drain region and a second source/drain region disposed in the active region at two sides of the gate structure;
    forming a first conductive layer over the substrate;
    forming a second conductive layer and a hard mask layer on the first conductive layer, sequentially;
    forming a hemispherical-grained (HSG) layer on the hard mask layer;
    patterning the hard mask layer through the HSG layer to form a hard mask pattern on the second conductive layer;
    etching the second conductive layer through the hard mask pattern to form a plurality of conductive pillars over the substrate; and
    forming a dielectric layer over the plurality of conductive pillars,
    wherein sidewalls of the plurality of conductive pillars are in contact with the dielectric layer, and top surfaces of the plurality of conductive pillars are separated from the dielectric layer by the hard mask pattern.

9. The method of claim 8, further comprising removing the hard mask pattern before the forming of the dielectric layer.

10. The method of claim 9, wherein top surfaces and sidewalls of the plurality of conductive pillars are in contact with the dielectric layer.

11. The method of claim 8, further comprising forming a third conductive layer on the dielectric layer.

* * * * *